United States Patent [19]
Koike et al.

[11] Patent Number: 5,955,865
[45] Date of Patent: Sep. 21, 1999

[54] CONTROL SYSTEM FOR A VEHICLE-MOUNTED BATTERY

[75] Inventors: Tetsuo Koike; Satoshi Masuda, both of Tokyo, Japan

[73] Assignee: Hino Jidosha Kogyo Kabushiki Kaisha, Tokyo, Japan

[21] Appl. No.: 09/023,076

[22] Filed: Feb. 13, 1998

Related U.S. Application Data

[63] Continuation of application No. PCT/JP97/01980, Jun. 10, 1997.

[30] Foreign Application Priority Data

Jun. 17, 1996 [JP] Japan ................................. 8-155707
Jun. 21, 1996 [JP] Japan ................................. 8-161916

[51] Int. Cl.$^6$ ................................................. H01M 10/46
[52] U.S. Cl. ........................................................ 320/104
[58] Field of Search ................................. 320/104, 119,
320/123, 128, 134, FOR 114, FOR 129,
FOR 138, FOR 148, FOR 157, FOR 160;
322/10, 11, 39, 44; 180/65.1, 65.3

[56] References Cited

U.S. PATENT DOCUMENTS

| | | | |
|---|---|---|---|
| 4,305,254 | 12/1981 | Kawakatsu et al. | 60/716 |
| 5,412,251 | 5/1995 | Furutani et al. | 180/69.5 X |
| 5,608,308 | 3/1997 | Kiuchi et al. | 322/11 |
| 5,684,383 | 11/1997 | Tsuji et al. | 320/134 |

FOREIGN PATENT DOCUMENTS

| | | |
|---|---|---|
| 2589008 | 4/1987 | France . |
| PCT/JP88/ 0015 | 2/1988 | Japan . |
| 3-203501 | 9/1991 | Japan . |
| 3-115478 | 11/1991 | Japan . |
| 5-219608 | 8/1993 | Japan . |
| 6-261411 | 9/1994 | Japan . |
| 6-283210 | 10/1994 | Japan . |
| 7-274306 | 10/1995 | Japan . |
| PCT/JP96/ 0096 | 4/1996 | Japan . |
| 2319407 | 5/1998 | United Kingdom . |

OTHER PUBLICATIONS

Minoru Kitagawa, et al., "Development of Battery State Charge Indicator for Electric Vehicles", Dec. 5, 1994, International Electric Vehicle Symposium, Anaheim, Dec. 5–7, 1994, vol. 1, Symp. No. 12, pp. 293–302, Electric Vehicle Association of the Americas.

Jiri K. Nor, et al., "Very Fast Battery Charging and Battery Energy Management", Dec. 5, 1994, International Electric Vehicle Symposium, Anaheim, Dec. 5–7, 1994, vol. 1, Symp. No. 12, pp. 117–125, Electric Vehicle Association of the Americas.

*Primary Examiner*—Edward H. Tso
*Attorney, Agent, or Firm*—Pillsbury Madison & Sutro LLP

[57] ABSTRACT

The state of charging and discharging of a secondary cell circuit varies with battery deterioration and with the margin for charging and discharging. The state of charging and discharging is detected accurately without coming into contact with any unit cells, and maintenance and inspection can be performed efficiently. Charging and discharging characteristics of the battery are held in a memory, and charging current and discharging current are controlled by comparing measured voltage and current values with the charging and discharging characteristics held in the memory. Furthermore, battery information relating to each unit cell is transmitted by radio signals and the substance of this information is displayed at the driver's seat.

6 Claims, 26 Drawing Sheets

CONTROL SYSTEM FOR A VEHICLE-MOUNTED BATTERY

This is a continuation of International Appl. no. PCT/JP/97/01980 Jun. 10, 1997.

TECHNICAL FIELD

The present invention is utilized for an electric vehicle which uses an electric motor for driving power. It relates to controlling the charging and discharging of a rechargeable vehicle-mounted battery. Although the present invention was developed for a hybrid car which makes combined use of an internal combustion engine and an electric motor for driving power, it can be widely utilized in vehicles in which a rechargeable battery is mounted and which utilize the energy of this battery for running.

BACKGROUND ART

The present applicant developed, and now manufactures and sells, a hybrid car called the HIMR which makes combined use of an internal combustion engine and an electric motor. In this vehicle, a three-phase alternating current squirrel-cage induction machine is coupled to the crankshaft of the internal combustion engine, a large battery is mounted on the vehicle, a bidirectional inverter circuit is coupled between this battery and the squirrel-cage induction machine, and this inverter circuit is controlled by a program control circuit (see WO88/06107).

With this system, when the vehicle accelerates, the rotating magnetic field applied to the squirrel-cage induction machine is controlled so that the squirrel-cage induction machine constitutes an electric motor, and when the vehicle decelerates, the rotating magnetic field applied to the squirrel-cage induction machine is controlled so that the squirrel-cage induction machine constitutes a generator. The control performed by this system is such that the battery discharges when the squirrel-cage induction machine is utilized as an electric motor, and the battery charges when it is utilized as a generator. In other words, this system is controlled to provide regenerative braking.

This system has been mounted on large buses and has been applied to buses on urban routes and to buses operating in regions where it is essential to keep pollution extremely low. In recent years, pollution from the exhaust of vehicles with internal combustion engines has become a major problem, and this has led to discussion of the possibility that most vehicles being run in urban areas will become electric vehicles, despite the higher price of such vehicles and the fact that their fuel is quite expensive.

The HIMR described above is arranged to provide a battery compartment in the vehicle, to use batteries with a terminal voltage of 12 V as unit cells, such batteries being mass produced and therefore inexpensive to procure, and to mount twenty-five of these in the battery compartment and connect them electrically in series to give an overall terminal voltage of 12 V×25=300 V. This arrangement is utilized as the battery for supplying energy for running the vehicle.

The term "unit cell" here signifies the unit which, when a multiplicity are connected in series, comprises the battery for supplying energy to run the vehicle. For example, although in the case of a lead storage battery the chemical properties dictate that the terminal voltage of the smallest unit cell is 2 V, a commercial battery generally comprises a plurality of these 2 V cells connected in series and housed in one casing. For example, in the case of a lead storage battery, the terminal voltage of the unit cell can be 2 V, 4 V, 6 V, 12 V, 24 V and so forth. For other kinds of battery, the terminal voltage of the unit cell is determined by the chemical properties of the cell and by the number of cells connected in series.

The present applicant has filed an International Patent Application (see PCT/JP96/00966 and WO96/32651) relating to the monitoring of unit cells.

When a vehicle is started or accelerated using the squirrel-cage induction machine as an electric motor, energy is extracted from the battery and used, and therefore the battery discharges. When a vehicle decelerates and the squirrel-cage induction machine is operated as a generator, regenerative braking takes place and the battery charges. In a battery which repeatedly charges and discharges in this manner, charging and discharging are not necessarily in a state of equilibrium.

Discharging time will be longer when running along a road with many upward slopes, while charging time will be longer when travelling along a road with many downward slopes. Because the type of battery in present use is basically the lead storage battery, consideration has to be given to battery deterioration due to overcharging or over-discharging.

Hitherto, the relevant control has been carried out by measuring the terminal voltage of the unit cells. For example, given a unit cell with a standard voltage of 12 V, if the voltage at which charging is ended is set at 13.2 V and the voltage at which discharging is ended is set at 11.4 V, the unit cell is controlled so that an overcharging warning is displayed and charging automatically stopped if 13.2 V is exceeded, and so that an over-discharge warning is displayed and discharging automatically stopped if the voltage drops below 11.4 V.

However, battery deterioration proceeds during repeated charging and discharging, and the quantity of electricity which can be charged and discharged decreases. Namely, with a battery in which deterioration has progressed, during charging the voltage at which charging is ended will be reached despite the fact that the battery has not been fully charged. During discharging under load, the battery voltage will end up below the voltage at which discharge should be ended. Consequently, if charging and discharging control is performed on the basis of terminal voltage and the state of battery deterioration is ignored, the resulting control will sometimes restrict charging despite further charging being possible, and will sometimes perform further charging despite no more charging being possible.

Furthermore, although a battery for storing energy for driving a vehicle uses a plurality of unit cells connected in series, these series-connected unit cells do not deteriorate uniformly. Instead, there is variability in their deterioration and this increases if uniform charging and discharging are performed.

Hitherto, charging current and discharging current have been controlled on the basis of terminal voltage in the manner described above, and therefore the control has not been of the sort which causes the voltage at which charging is ended and the voltage at which discharge is ended, these voltages constituting the basis for this control, to vary with the deterioration of the unit cells. As a measure for avoiding overcharging or over-discharging of a battery in which deterioration is advanced, the voltage at which charging is ended and the voltage at which discharging is ended are set in advance to suit a battery with advanced deterioration. This means that for a new battery, full use is not made of its storage capacity.

By performing repeated experiments, the present inventor has been able to obtain a large number of records relating to the running and maintenance of the HIMR vehicles mentioned above. A battery gradually deteriorates with repeated charging and discharging, and therefore has to be replaced after a certain time. However, a careful study of the aforesaid maintenance records has shown that even for buses operating on routes involving relatively uniform driving conditions, battery life is by no means uniform and instead exhibits large variability. It was also noticed that although charging and discharging were carried out on a large number of series-connected unit cells, each unit cell under these conditions had individual characteristics, and despite the series connection charging and discharging were not carried out uniformly.

This will be explained in detail. If for example twenty-five unit cells are discharged when connected in series, energy is not released uniformly from all twenty-five unit cells. Furthermore, when charging series-connected unit cells, not all the cells are charged uniformly. This is easily understood in terms of electrical characteristics by assuming that the internal resistance (R) of the individual unit cells is not equal. The series connection means that the current (I) is equal, but during charging and discharging the charging or discharging energy per unit time ($I^2R$) will not be equal. A unit cell with a higher internal resistance will have a higher terminal voltage during charging than the other unit cells, and conversely will have a lower terminal voltage during discharge than the other unit cells. Even assuming that the terminal voltages are actually equal, if all the unit cells are repeatedly charged and discharged at a standard or rated voltage, a cell with a high internal resistance will end up being overcharged during charging, with the result that this unit cell alone will undergo accelerated deterioration. Furthermore, despite being charged and discharged on the basis of series connection, a unit cell with a high internal resistance will acquire an elevated cell temperature, with the result that its characteristics will differ from those of the other unit cells, and again this unit cell alone will end up deteriorating before the other unit cells.

The inventor has carried out various trials such as housing unit cells from the same production lot in one battery compartment. It was discovered that even if the characteristics of the unit cells in a new vehicle are uniform, when the vehicle has been used for a long period of time these characteristics exhibit variability, and non-uniform deterioration accelerates. In general it is not individual unit cells of a battery which are replaced, but rather all the unit cells are replaced simultaneously. This is clearly a cause of shortened battery life. Moreover, the use and subsequent disposal of large numbers of batteries will constitute a new source of pollution.

The maintenance and inspection of unit cells should therefore involve measuring the voltage and current of each unit cell after connection of a suitable load, and then, for each unit cell and in accordance with the state of deterioration of that cell, taking appropriate action aimed at avoiding variability in the characteristics of the unit cells.

In the prior art, the maintenance and inspection of a high-voltage battery of this sort requires that measuring equipment be connected to cell terminals. Even when it is thought that just one or two of a large number of series-connected unit cells have become defective, the maintenance and inspection of a conventional high-voltage battery has necessitated connecting measuring equipment to the terminals of each and every unit cell and making a large number of measurements in order to discover which unit cells are defective. It is therefore stipulated that the maintenance and inspection of a high-voltage battery of this sort has to be carried out by someone who has received a prescribed training and who carefully employs a stipulated safe procedure. This means that maintenance and inspection cannot be performed freely by the driver and that each vehicle has to be taken to a designated vehicle service center, etc.

The present situation is therefore that although it is important from the point of view of avoiding breakdowns for the driver of a vehicle to inspect the battery either before or after operating the vehicle, or while driving, in the case of a high-voltage battery this is usually impossible for the driver to do.

Against such a background, it is an object of the present invention to provide a control system for a vehicle-mounted battery which is capable of making full use of the storage capacity of the battery. It is a further object of the present invention to provide an arrangement for adaptively controlling the terminal voltage limit during charging in accordance with the state of deterioration of the battery. It is yet another object of the present invention to provide an arrangement for adaptively controlling the terminal voltage limit during discharging in accordance with the state of deterioration of the battery. It is a further object of the present invention to provide a control system for a vehicle-mounted battery which is capable of increasing battery life. It is still another object of the present invention to provide an arrangement which, for a battery comprising a plurality of series connected unit cells, can control the state of deterioration of each of these unit cells.

It is an object of the present invention to provide an arrangement which can facilitate maintenance and inspection. It is another object of the present invention to provide an information transmission arrangement which simplifies battery maintenance. It is yet another object of the present invention to provide an arrangement whereby maintenance personnel can make measurements without coming into contact with live parts of the battery. It is a further object of the present invention to provide an arrangement whereby the state of deterioration of the battery can be found while the battery is in use. It is yet another object of the present invention to provide an arrangement whereby the state of a battery mounted on an electric vehicle can be detected while the vehicle is travelling.

DISCLOSURE OF INVENTION

A first aspect of the present invention is a control system for a vehicle-mounted battery, and its distinguishing features are that it comprises a polyphase alternating current rotating machine coupled to the driving gear of a vehicle, an inverter circuit provided between this polyphase alternating current rotating machine and the battery mounted on the vehicle, said inverter performing AC-to-DC or DC-to-AC conversion, and a program control circuit for controlling this inverter circuit; and also comprises means for measuring the current and voltage of the aforesaid battery during discharge and during charging; and the program control circuit comprises means for controlling, via the inverter circuit and on the basis of the voltage and current information measured by the aforesaid means, the charging current and/or the discharge current of the battery.

As a result, the charging current and/or the discharging current can be controlled with precision, said control combining voltage and current values.

The program control circuit preferably comprises memory means for holding information regarding current and voltage during discharge (discharge IV characteristics) and current and voltage during charging (charging IV characteristics).

Discharge IV characteristic and charging IV characteristics based on data obtained by measurements made on batteries can be held in this memory means, and control of charging current and/or discharge current can be performed while comparing these stored characteristics with the present voltage and current values.

It is also possible to provide the aforesaid battery with battery sensors for detecting the terminal voltage of the unit cells, to supply the program control circuit with the detection output of these battery sensors, and for the program control circuit to comprise means for adjusting the charging and/or discharging current in accordance with this unit cell terminal voltage information.

By having battery sensors for detecting the terminal voltage of the individual unit cells, the program control circuit can ascertain the state of deterioration of each unit cell. By setting the voltage at which charging is ended, or the voltage at which discharging is ended, to suit, from among the plurality of unit cells, that unit cell in which deterioration is most advanced, it is possible to avoid further promoting the deterioration of a unit cell in which deterioration is already advanced.

A second aspect of the present invention is an information transmission arrangement for a vehicle-mounted battery, and its distinguishing features are that the unit cells are each provided with a sensor for detecting information including voltage information relating to that unit cell, and with a transmitter for transmitting a radio signal which has been modulated by the output of that sensor; and a receiver for receiving these radio signals is disposed in or in the vicinity of the battery compartment; and separate information relating to each unit cell is received at this receiver. As a result of this arrangement, information for controlling the high-voltage battery can be obtained without direct contact with the high-voltage battery.

The radio signals preferably contain the identification codes which have been respectively set for each unit cell. This makes it possible to extract information relating to individual unit cells from the radio signals which arrive from the plurality of unit cells.

It is also possible to provide a current sensor so that the information detected will include information relating to the current of the unit cells. Because information which includes the value of the current as well as the voltage can be obtained, more detailed control data can be obtained.

It is further possible to provide temperature sensors for detecting information which contains information relating to the temperature of the unit cells. This makes it possible to obtain information which includes temperature information in addition to voltage values and current values, thereby again enabling more detailed control data to be obtained.

It is also possible to provide a program control circuit which processes the aforementioned information. This enables the information obtained to be displayed in processed form, so that the situation can be grasped immediately.

BEST MODE FOR CARRYING OUT THE INVENTION

Embodiments of the present invention will now be explained with reference to the drawings.

First Embodiment

Figure 1:
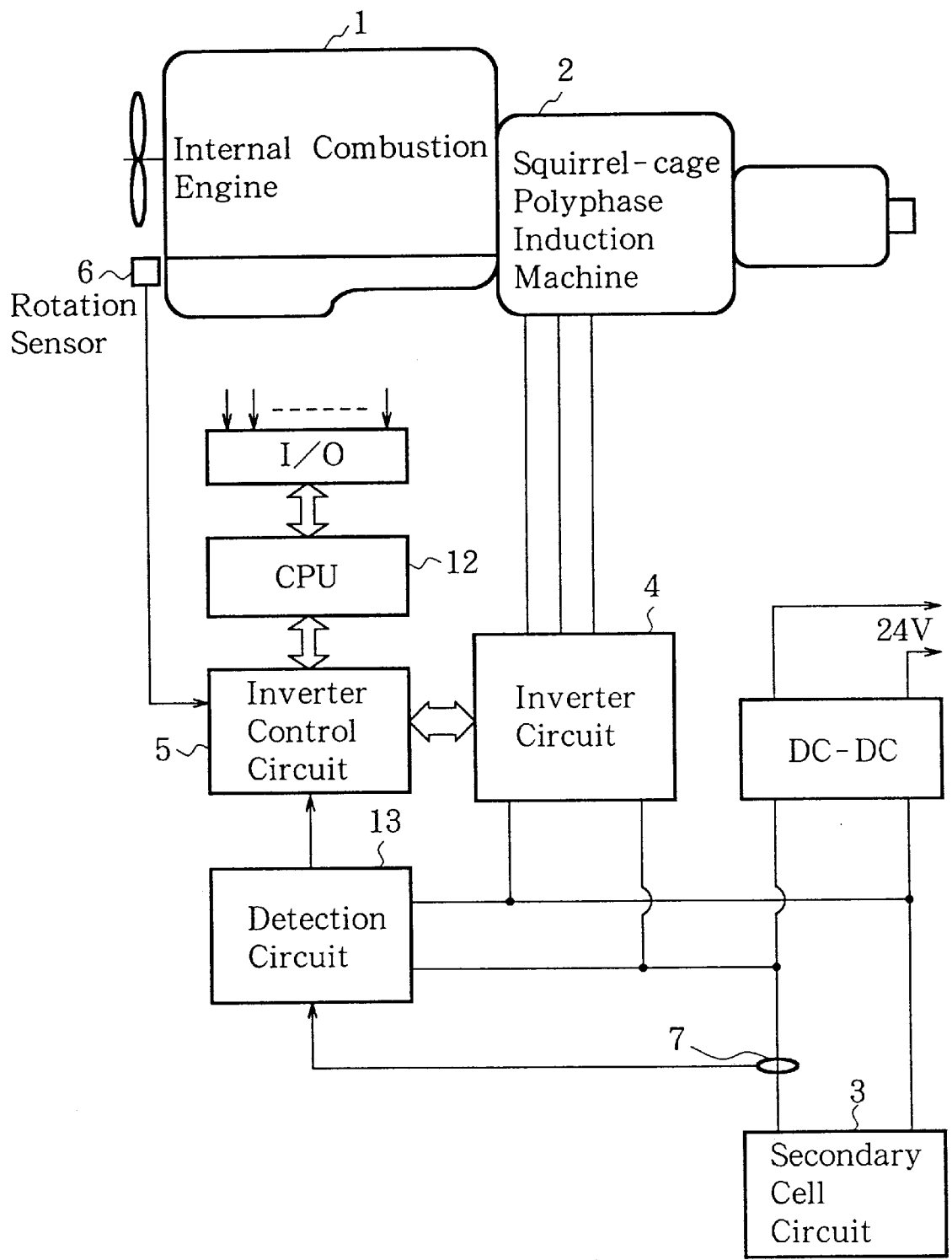
FIG. 1 is a block diagram showing the overall conFiguration of an HIMR pertaining to a first embodiment of the present invention.
Figure 2:
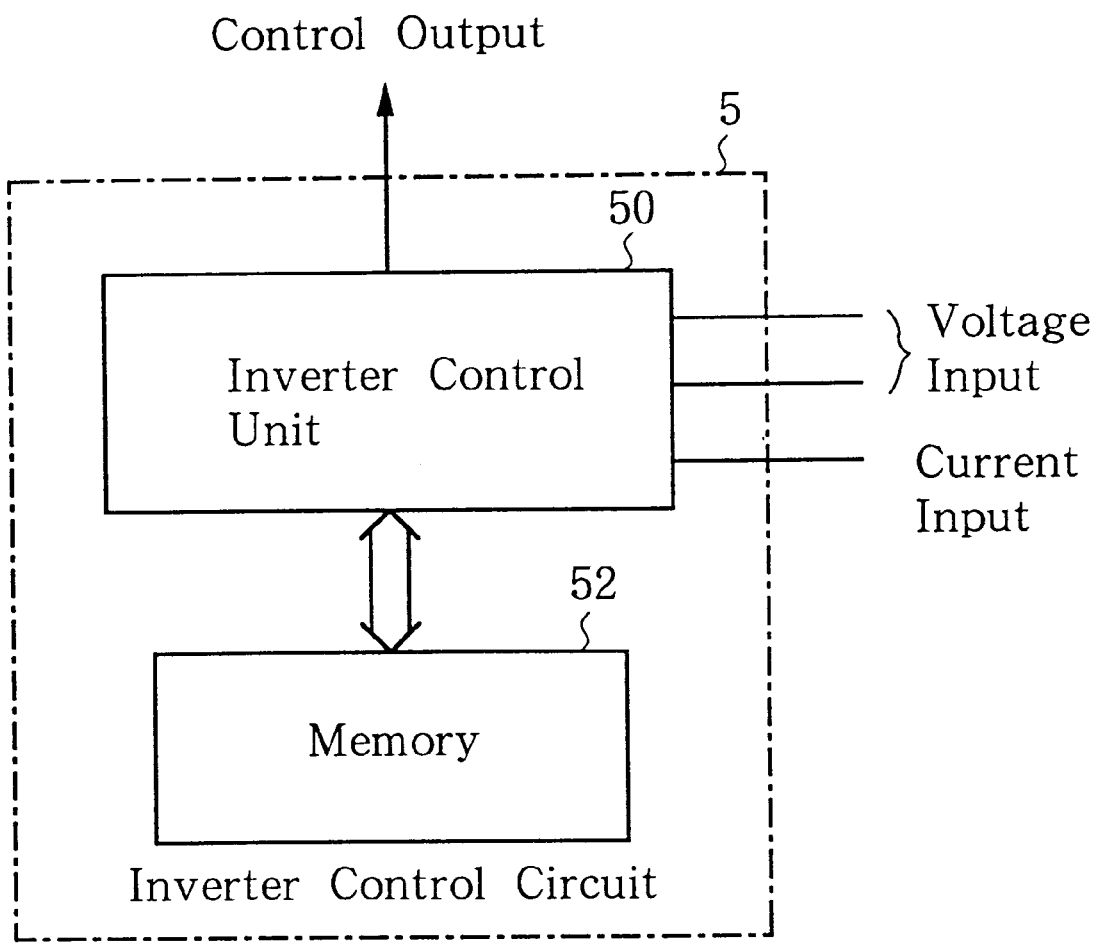
FIG. 2 is a block diagram showing the conFiguration of the inverter control circuit in the first embodiment of the present invention.

The conFiguration of a first embodiment of the present invention will be explained with reference to FIG. 1 and FIG. 2. FIG. 1 is a block diagram showing the overall conFiguration of an HIMR pertaining to a first embodiment of the present invention. FIG. 2 is a block diagram showing the conFiguration of the inverter control circuit in the first embodiment.

The present invention is a control system for a vehicle-mounted battery, and its distinguishing features are that it comprises squirrel-cage polyphase induction machine 2 serving as a polyphase alternating current rotating machine coupled to internal combustion engine 1 serving as the driving gear of the vehicle, inverter circuit 4 provided between this squirrel-cage polyphase induction machine 2 and secondary cell circuit 3 mounted on the vehicle, said inverter circuit 4 performing AC-to-DC or DC-to-AC conversion, and inverter control circuit 5 serving as a program control circuit for controlling this inverter circuit 4; and also comprises detection circuit 13 as means for measuring the current and voltage of secondary cell circuit 3 during discharge and during charging; and inverter control circuit 5 comprises means for controlling, via inverter circuit 4 and on the basis of the voltage and current information measured by detection circuit 13, the charging current and discharging current, or one or other of these, of secondary cell circuit 3.

Inverter control circuit 5 comprises inverter control unit 50 for controlling inverter circuit 4, and memory 52 for holding information regarding current and voltage during discharge (discharge IV characteristics) and current and voltage during charging (charging IV characteristics).

The hybrid car (HIMR) illustrated in FIG. 1 will now be explained. This vehicle is constituted in such manner that three-phase alternating current squirrel-cage polyphase induction machine 2 is coupled to the crankshaft of internal combustion engine 1, large secondary cell circuit 3 is mounted on the vehicle, this secondary cell circuit 3 and squirrel-cage polyphase induction machine 2 are coupled by means of bidirectional inverter circuit 4 which performs AC-to-DC or DC-to-AC conversion, and this inverter circuit 4 is controlled by inverter control circuit 5. Detection circuit 13 inputs the voltage of secondary cell circuit 3 and the current of current detector 7 to inverter control circuit 5. Inverter control circuit 5 controls inverter circuit 4 in accordance with the inputs from detection circuit 13, rotation sensor 6 and CPU 12.

Inverter control circuit 5 controls inverter circuit 4 in such manner that when the vehicle starts or accelerates, the rotating magnetic field applied to this squirrel-cage polyphase induction machine 2 is controlled so that squirrel-cage polyphase induction machine 2 constitutes an electric motor, and when the vehicle decelerates, the rotating magnetic field applied to squirrel-cage polyphase induction machine 2 is controlled so that squirrel-cage polyphase induction machine 2 constitutes a generator. The control performed by this system is such that secondary cell circuit 3 discharges when squirrel-cage polyphase induction machine 2 is utilized as an electric motor, and charges when induction machine 2 is utilized as a generator. In other words, this system is controlled to provide regenerative braking. It is also possible to operate internal combustion engine 1 when the hybrid car is stationary, with the sole object of charging secondary cell circuit 3.

Figure 3:
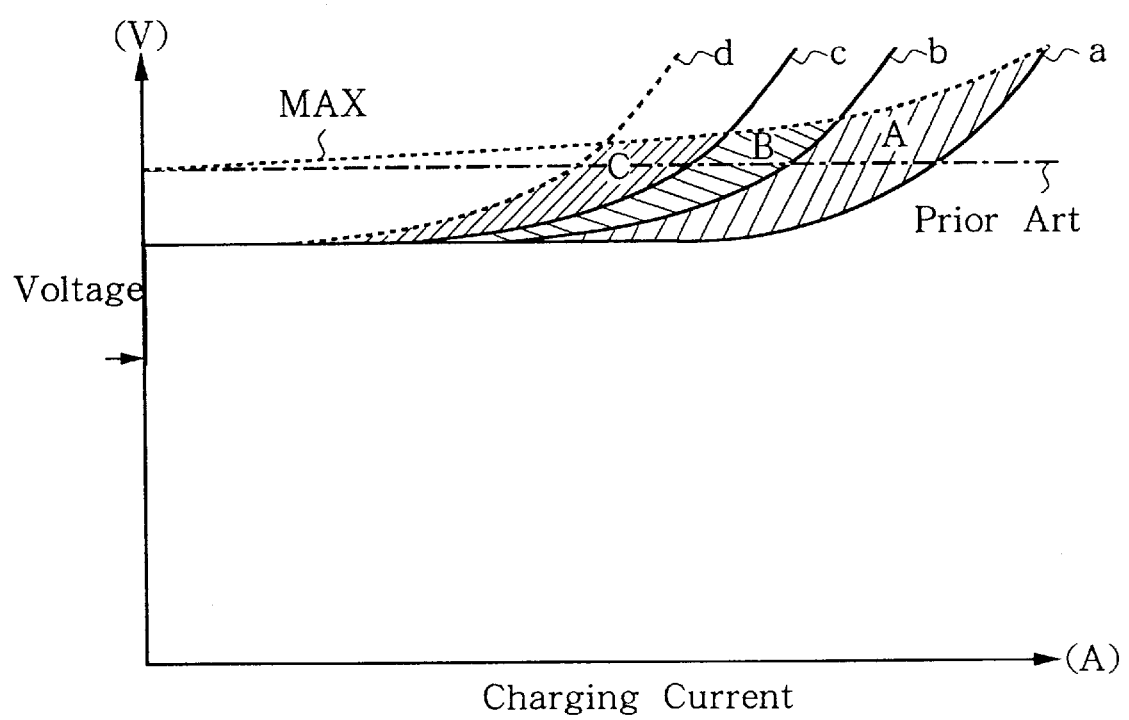
FIG. 3 shows the charging characteristics of the secondary cell circuit in the first embodiment of the present invention.

The working of the first embodiment of the present invention will now be explained with reference to FIG. 3 to FIG. 6. FIG. 3 shows the charging characteristics of the secondary cell circuit in the first embodiment, with charging current plotted along the horizontal axis and voltage along the vertical axis. The charging characteristics illustrated in FIG. 3 are held in memory 52 of inverter control circuit 5. As shown in FIG. 3, curve a shows the situation in which the cells of secondary cell circuit 3 are new and have been slightly charged. Curve b shows the situation in which the cells of secondary cell circuit 3 are new and have been charged a medium amount. Curve c shows the situation in which the cells of secondary cell circuit 3 are new and have been fully charged. Curve d shows the situation in which deterioration of the unit cells of secondary cell circuit 3 has advanced to an extent where replacement is required. The upper limit MAX shows the voltage at which charging is ended and at which the control system of this first embodiment of the invention performs control. This upper limit MAX rises to the right in FIG. 3, in contrast to the prior art case shown by the dash and dotted line. This shows that when a battery is new and only slightly charged, it is controlled so that its charging current, or in other words its terminal voltage during charging, becomes higher than in the prior art. It follows that the capacity of the battery is utilized to the full in accordance with the condition of the battery. Conversely, when battery deterioration has advanced to an extent where replacement is required, the control ensures that the voltage at which charging is ended is set lower, so that the battery is not over-charged by the supply of a large charging current.

Figure 4:
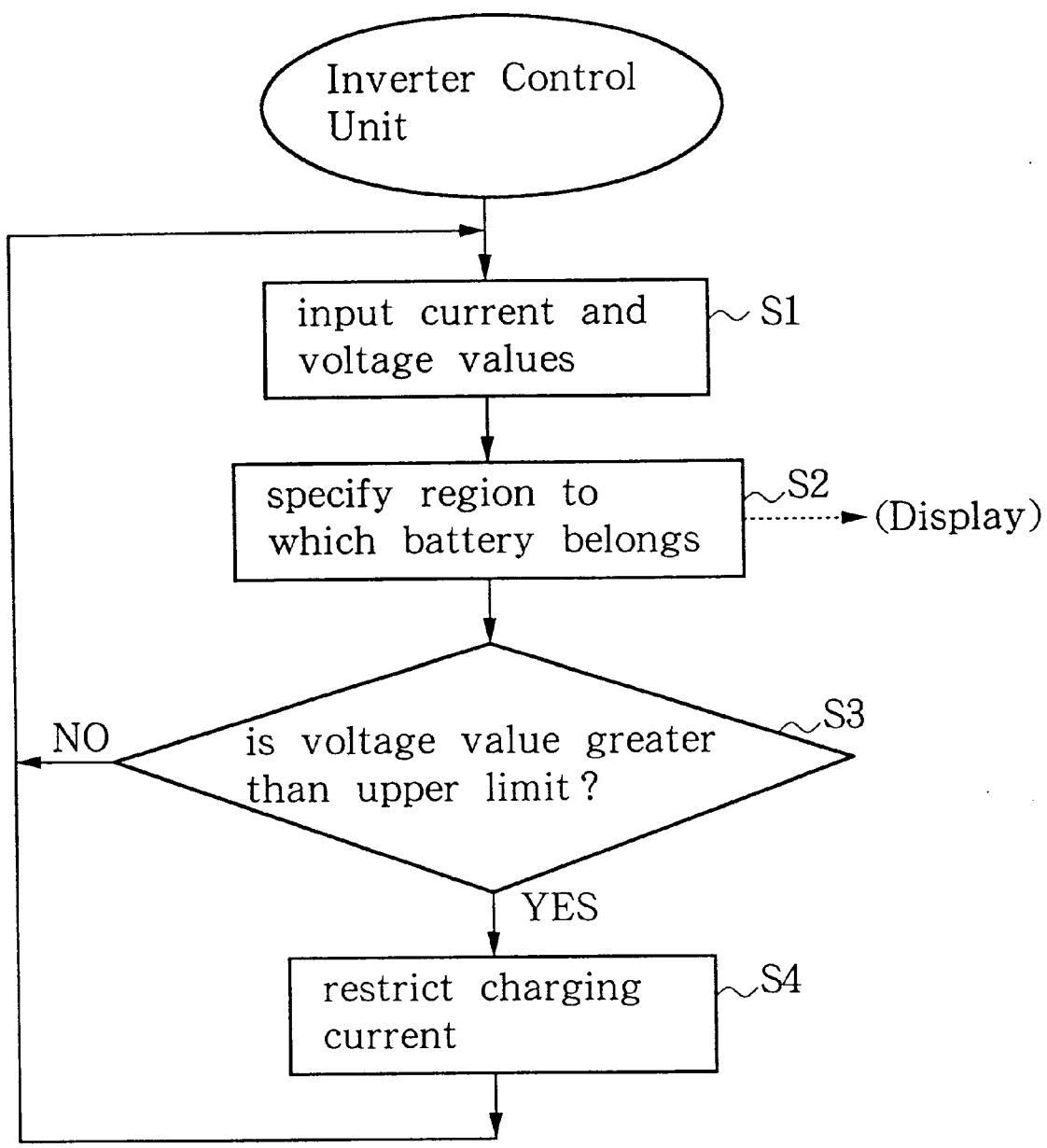
FIG. 4 is a flowchart showing the operating flow of the inverter control unit when charging is carried out in the first embodiment of the present invention.

FIG. 4 is a flowchart showing the operating flow of the inverter control unit when charging is carried out in a first embodiment of the present invention. The current and voltage values at this time are input from detection circuit 13 to inverter control unit 50 (S1). The region A, B or C to which secondary cell circuit 3 presently belongs is specified in accordance with these current and voltage values (S2). Namely, the present current and voltage values are compared with the charging characteristics shown in FIG. 3 and which are held in memory 52, and what sort of condition secondary cell circuit 3 is in is grasped. If secondary cell circuit 3 falls within region A, the unit cells of secondary cell circuit 3 are new and have been slightly charged. If it falls within region B, the unit cells of secondary cell circuit 3 are new and have been moderately charged. If it falls within region C, deterioration of the unit cells of secondary cell circuit 3 has proceeded to an extent where replacement is required. At the same time, the region A, B or C within which secondary cell circuit 3 falls can be indicated externally.

Namely, if the secondary cell circuit falls within region A the display can indicate that "charging is required"; if it falls within region B the display can indicate "normal", and if it falls within region C the display can indicate that "cell replacement is required". The value of the upper limit MAX changes according to which region A, B or C the secondary cell circuit belongs. If the voltage value is greater than the upper limit MAX for the region A, B or C to which the secondary cell circuit belongs (S3), charging current increase is restricted (S4). The present value of the voltage can be maintained by restricting any increase in the charging current.

Two battery states were distinguished in the foregoing explanation: "new" and "requiring replacement". However, in actual use a battery may be between these two states. In actuality, when battery deterioration begins, curves a, b and c shown in FIG. 3 gradually approach curve d. Regions A, B and C undergo corresponding changes in shape and their area decreases. In the present invention, by simultaneously detecting the charging current and the terminal voltage during charging, battery curves corresponding to curves a, b and c can be detected two-dimensionally. However, if the curve has gradually approached curve c, it cannot be told from these measurements alone whether this is due to deterioration having advanced or to the battery having gradually become fully charged. Nevertheless, there is no particular need to distinguish between these possibilities. These curves a to c are stored in advance in the memory in correspondence with one type of battery, and the control system is conFigured so that charging and discharging control is performed in accordance with this pattern. When the charging current versus voltage characteristic coincides with curve d, it is known that the battery has reached the condition in which replacement is required, and this is indicated.

The charging current is controlled by using inverter circuit 4 to change the speed of rotation of the rotating magnetic field applied to squirrel-cage polyphase induction machine 2. Namely, if the speed of rotation of the rotating magnetic field of squirrel-cage polyphase induction machine 2 is made smaller than the rotational speed of the crankshaft of internal combustion engine 1, squirrel-cage polyphase induction machine 2 acts as a generator. In order to limit the charging current, the quantity of electricity generated by squirrel-cage polyphase induction machine 2 acting as a generator can be decreased if the rotational frequency of the rotating magnetic field of squirrel-cage polyphase induction machine 2 approaches the rotational frequency of the crankshaft, or in other words if the amount of slip is reduced.

Figure 5:
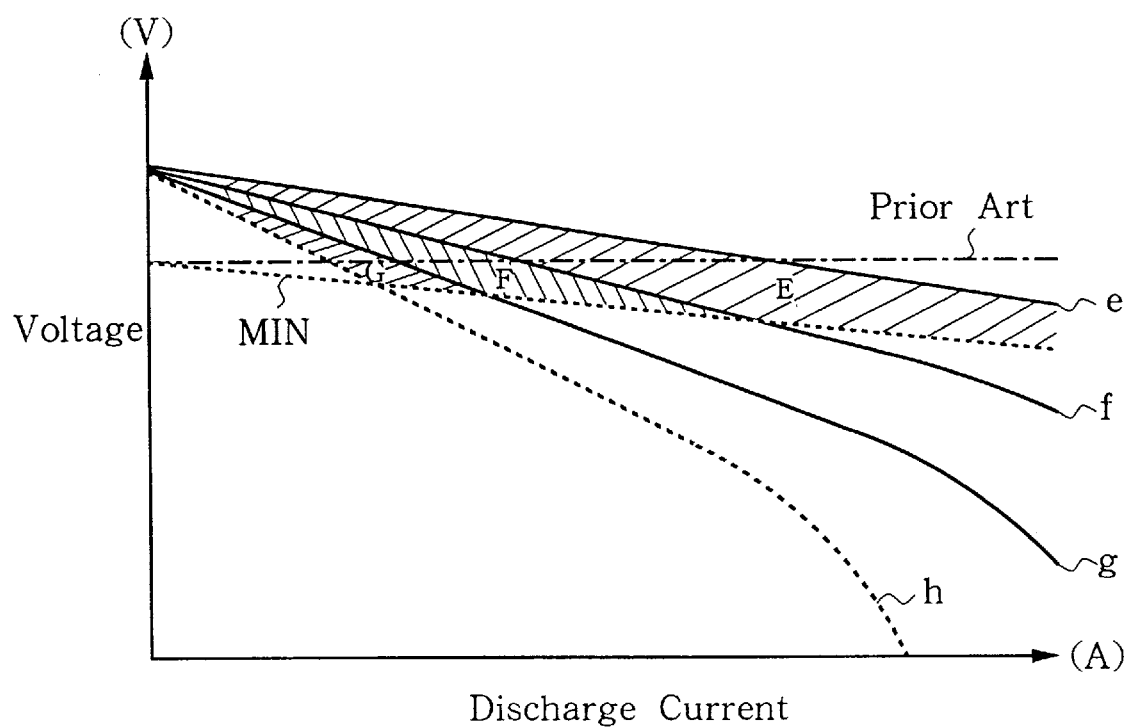
FIG. 5 shows the discharge characteristics of the secondary cell circuit in the first embodiment of the present invention.

FIG. 5 shows the discharge characteristics of secondary cell circuit 3 in the first embodiment of the present invention, with discharge current plotted along the horizontal axis and voltage along the vertical axis. The discharge characteristics illustrated in FIG. 5 are held in memory 52 of inverter control circuit 5. Curve e shows the situation in which the unit cells of secondary cell circuit 3 are new and fully charged. Curve f shows the situation in which the unit cells of secondary cell circuit 3 are new and have been moderately charged. Curve g shows the situation in which the unit cells of secondary cell circuit 3 are new and are poorly charged. Curve h shows the situation in which deterioration of the cells of secondary cell circuit 3 has advanced to an extent where replacement is required. The lower limit MIN shows the terminal voltage at which over-discharge will result if discharge continues beyond this limit. In the present invention, as shown in FIG. 5, this lower limit MIN slopes down to the right in contrast to the prior art case shown by the dash and dotted line. This shows that when a battery is new and fully charged, the limiting voltage for discharge can be set comparatively low. Conversely, it shows that when battery deterioration has advanced to an extent where replacement is required, the limiting voltage for discharge is comparatively high, or in other words a large discharge current cannot be obtained.

Figure 6:
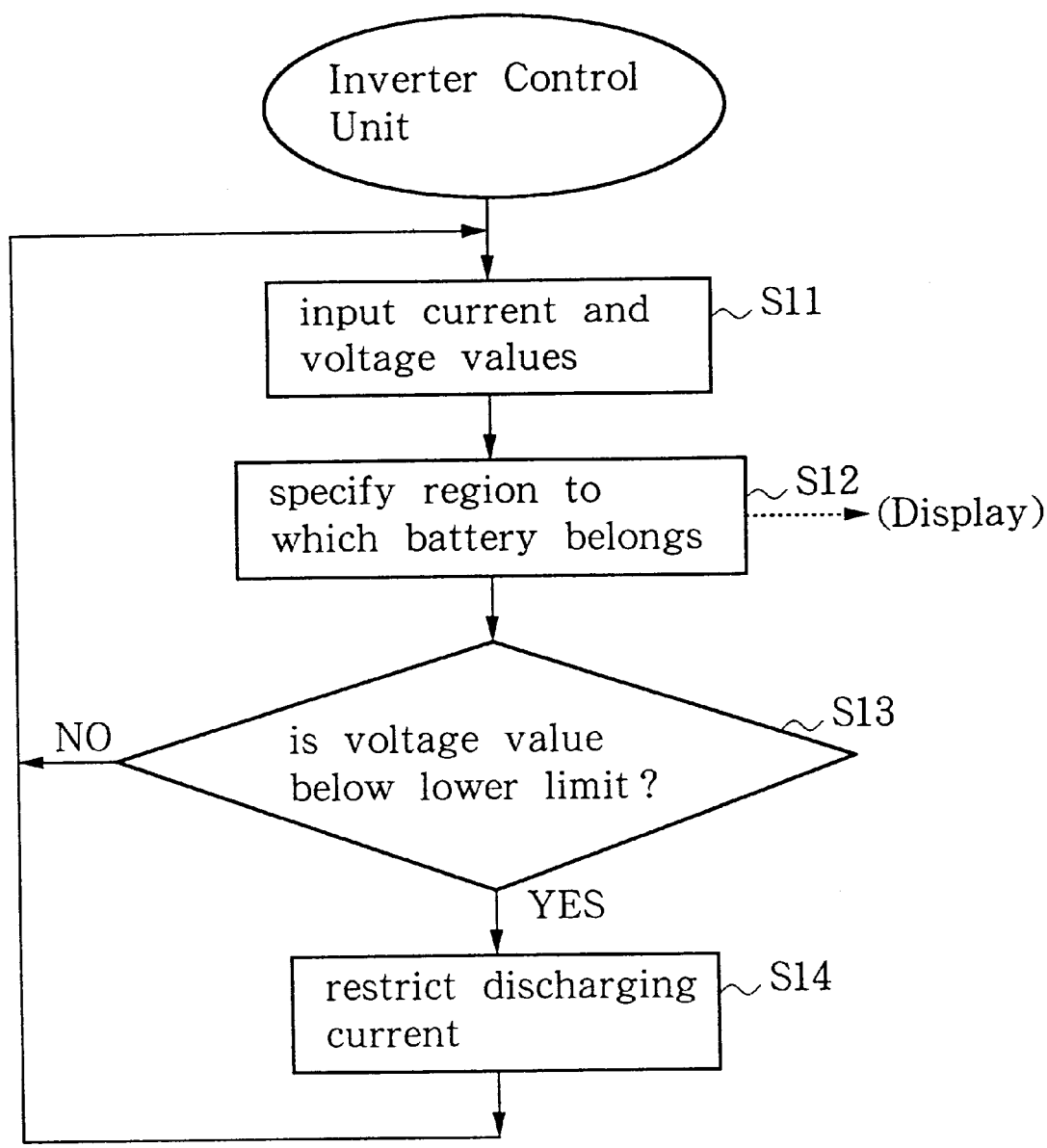
FIG. 6 is a flowchart showing the operating flow of the inverter control unit when discharging is carried out in the first embodiment of the present invention.

FIG. 6 is a flowchart showing the operating flow of the inverter control unit when discharging is carried out in the first embodiment of the present invention. The current and voltage values at this time are input from detection circuit 13 to inverter control unit 50 (S11). The region E, F or G to which secondary cell circuit 3 presently belongs is specified in accordance with these current and voltage values (S12). Namely, the present current and voltage values are compared with the discharge characteristics shown in FIG. 5 and which are held in memory 52, and the state of deterioration and state of charging of the cells of secondary cell circuit 3 are detected.

If the results of the detection indicate that the cells fall within region E, the cells of secondary cell circuit 3 are new and fully charged. If they fall within region F, the cells of secondary cell circuit 3 are new and moderately charged. If they fall within region G, the deterioration of the cells of secondary cell circuit 3 has advanced to an extent where replacement is required. At the same time, the region E, F or G within which the cells fall can be indicated externally. Namely, if the cells fall within region E the display can indicate that "discharging is required", whereas if they fall within region F the display can indicate "normal", and if the cells fall within region G the display can indicate that "cell replacement is required". The value of the lower limit MIN changes according to which region E, F or G the cells belong. If the voltage value is below the lower limit MIN for the region E, E or G to which the cells belong (S13), discharging current increase is restricted (S14). The present value of the voltage can be maintained by restricting any increase in the discharge current.

In the case of discharge the battery was subdivided into "new and poorly charged", "new and fully charged" and "requiring replacement", but an actual battery can be intermediate between new and requiring replacement. Namely, curve e will gradually approach curve h as use continues. At the same time, the shapes of regions E, F and G also change. However, although such measurements alone do not reveal whether the battery has deteriorated or whether it has become flat, these characteristics are stored in advance in the memory for each type of battery and the discharge current of the battery is controlled in accordance with these characteristics. These curves e to g can be recognized two-dimensionally by measuring discharge current and voltage simultaneously. Consequently, when discharge current and voltage approach curve h it can be indicated that this battery requires replacement.

The discharge current is controlled by using inverter circuit 4 to change the speed of rotation of the rotating magnetic field applied to squirrel-cage polyphase induction machine 2. Namely, if the speed of rotation of the rotating magnetic field of squirrel-cage polyphase induction machine 2 is larger than the rotational speed of the crankshaft of internal combustion engine 1, squirrel-cage polyphase induction machine 2 acts as an electric motor. In order to limit the discharge current, the power consumed by squirrel-cage polyphase induction machine 2 acting as an electric motor can be decreased if the rotational frequency of the rotating magnetic field of squirrel-cage polyphase induction machine 2 approaches the rotational frequency of the crankshaft, or in other words if the amount of slip is reduced.

As has been explained above, according to the present invention full use can be made of the storage capacity of a battery. Namely, the upper limit for terminal voltage during charging is controlled adaptively in accordance with the state of deterioration of the battery, and the lower limit for terminal voltage during discharge is controlled adaptively in accordance with the state of deterioration of the battery. According to the present invention, battery life can be increased. Furthermore, for batteries comprising a plurality of unit cells connected in series, the state of deterioration can be controlled for each unit cell individually.

Second Embodiment

Figure 7:
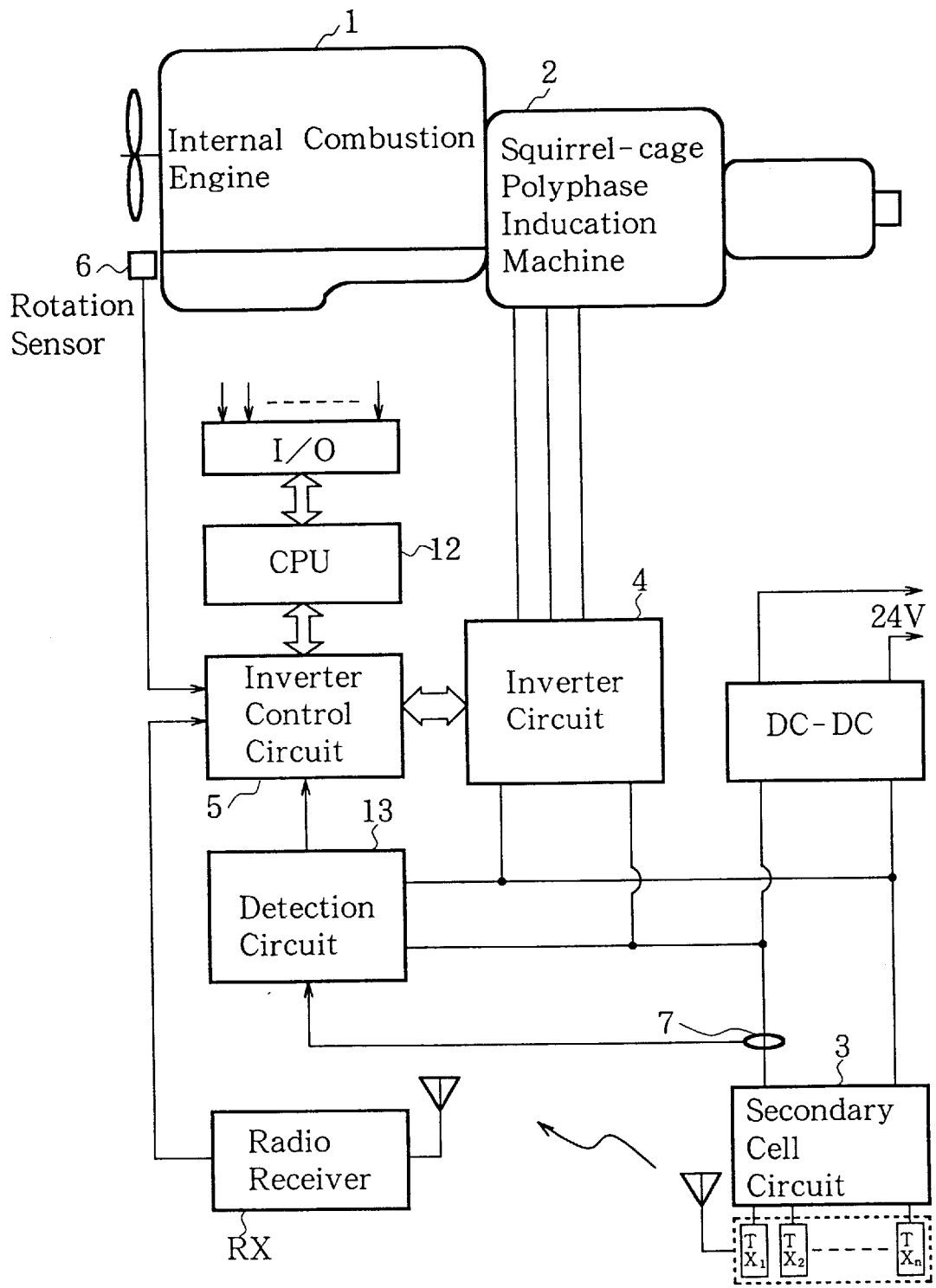
FIG. 7 is a block diagram showing the overall conFiguration of a second embodiment of the present invention.

A second embodiment of the present invention will be explained with reference to FIG. 7 to FIG. 11. FIG. 7 is a block diagram showing the overall conFiguration of this second embodiment. In this second embodiment a battery sensor is provided for each of a plurality of unit cells comprising secondary cell circuit 3, and this battery sensor detects the terminal voltage of the individual unit cell. The results of these detections are transmitted as radio signals by radio transmitters $TX_1$ to $TX_n$ belonging to the respective battery sensors. These radio signals are received by radio receiver RX and are input to inverter control circuit 5 as voltage information pertaining to the individual unit cells. Inverter control circuit 5 decides whether or not there are any unit cells at an advanced stage of deterioration, this decision being made in accordance with the voltage information from each unit cell and current information from current detector 7. If a cell at an advanced stage of deterioration is thereby discovered, the voltage at which charging is ended and the voltage at which discharge is ended are set to suit the characteristics of this cell. By doing this, the storage capacity of the other unit cells in which deterioration is not advanced cannot be utilized 100% efficiently, but it is possible to avoid accelerated deterioration of the unit cell in which deterioration has already proceeded. Moreover, an external display of information relating to a unit cell in which deterioration is advanced can prompt the replacement of that unit cell.

Figure 8:
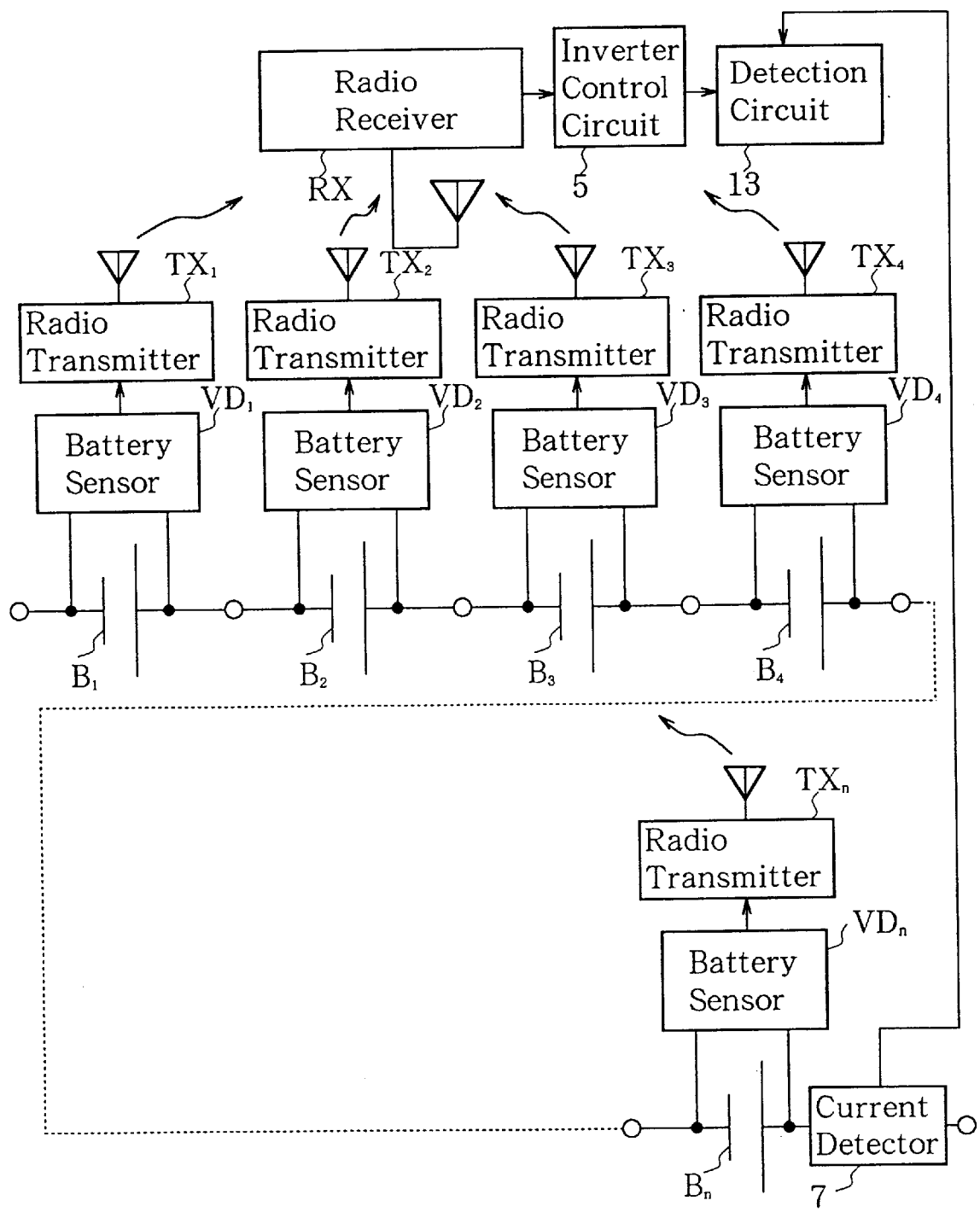
FIG. 8 is a block diagram showing the conFiguration of the essential parts of the second embodiment of the present invention.

FIG. 8 is a block diagram showing the conFiguration of the essential parts of this second embodiment of the present invention. N unit cells $B_1$ to $B_n$ are connected in series and provided with respective battery sensors $VD_1$ to $VD_n$. Battery sensors $VD_1$ to $VD_n$ are respectively provided with radio transmitters $TX_1$ to $TX_n$. The radio signals transmitted from radio transmitters $TX_1$ to $TX_n$ are received by radio receiver RX. The voltage values of each battery sensor $VD_1$ to $VD_n$ which are output from radio receiver RX are input to inverter control circuit 5, and the current value detected by current detector 7 is input to inverter control circuit 5 via detection circuit 13.

Figure 9:
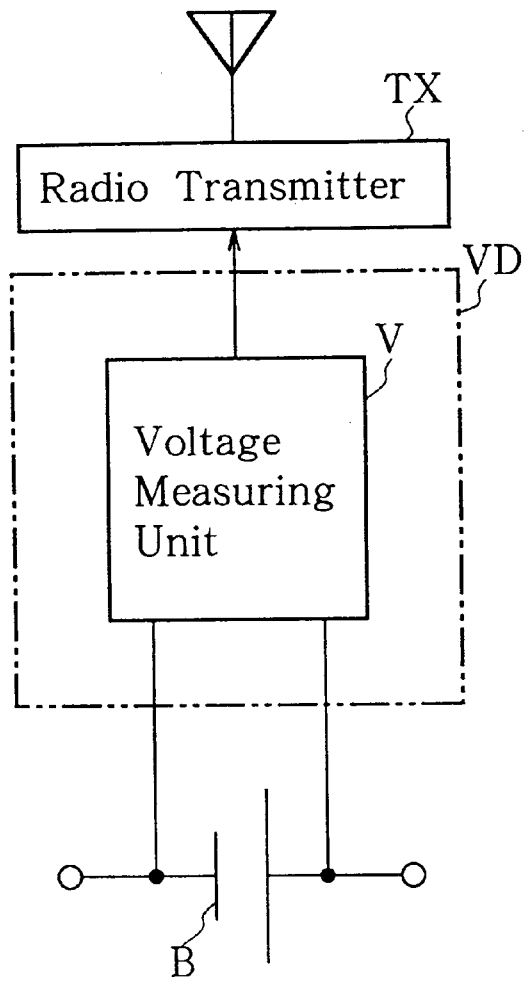
FIG. 9 is a block diagram showing the conFiguration of a battery sensor in the second embodiment of the present invention.

FIG. 9 is a block diagram showing the conFiguration of a battery sensor in this second embodiment. Voltage measuring unit V measures the terminal voltage of unit cell B. This measured value is converted to a radio signal and transmitted by radio transmitter TX.

Figure 10:
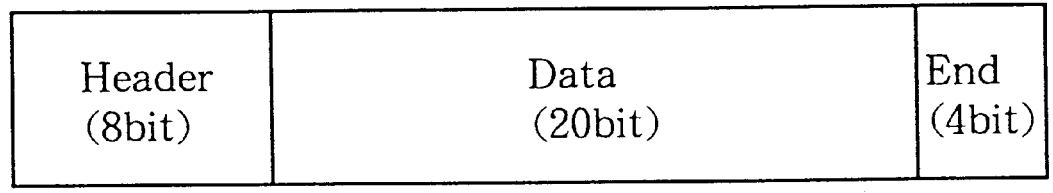
FIG. 10 shows the frame structure of a radio signal in the second embodiment of the present invention.

FIG. 10 shows the frame structure of the radio signal in the second embodiment of the present invention. In each period t, radio transmitter TX intermittently transmits, at 64 kb/s, a data signal with a 32-bit frame structure of the sort shown in FIG. 10. An ID which has been individually allocated to each transmitter TX is transmitted in the header. Receiver RX can therefore identify from which transmitter TX a received frame has been transmitted. In this embodiment, a mobile phone cell was adapted and used for this arrangement. The aforementioned period t is set in advance to a different value for each radio transmitter TX. The time for one transmission is approximately 20 ms. Period t is set in the range from 20 to 60 seconds so as to differ slightly for each transmitter TX. In virtue of such a constitution, radio receiver RX can receive the signal of each radio transmitter TX individually even if the transmission timings of the plurality of radio transmitters TX were to coincide, because in the next period the transmission timing would differ.

If a period is set to 20 seconds, then a time of 20 ms, within which one radio transmitter TXi is transmitting, is one thousandth of the period. Accordingly, if radio transmitters $TX_1$ to $TX_n$ respectively connected to twenty-five unit cells $B_1$ to $B_n$ transmit with random timing, there is an approximately 1 in 400 chance of a collision. Even if there were a collision, because the period t varies for each transmitter, the two signals could be received separately in the next period without collision.

Figure 11:
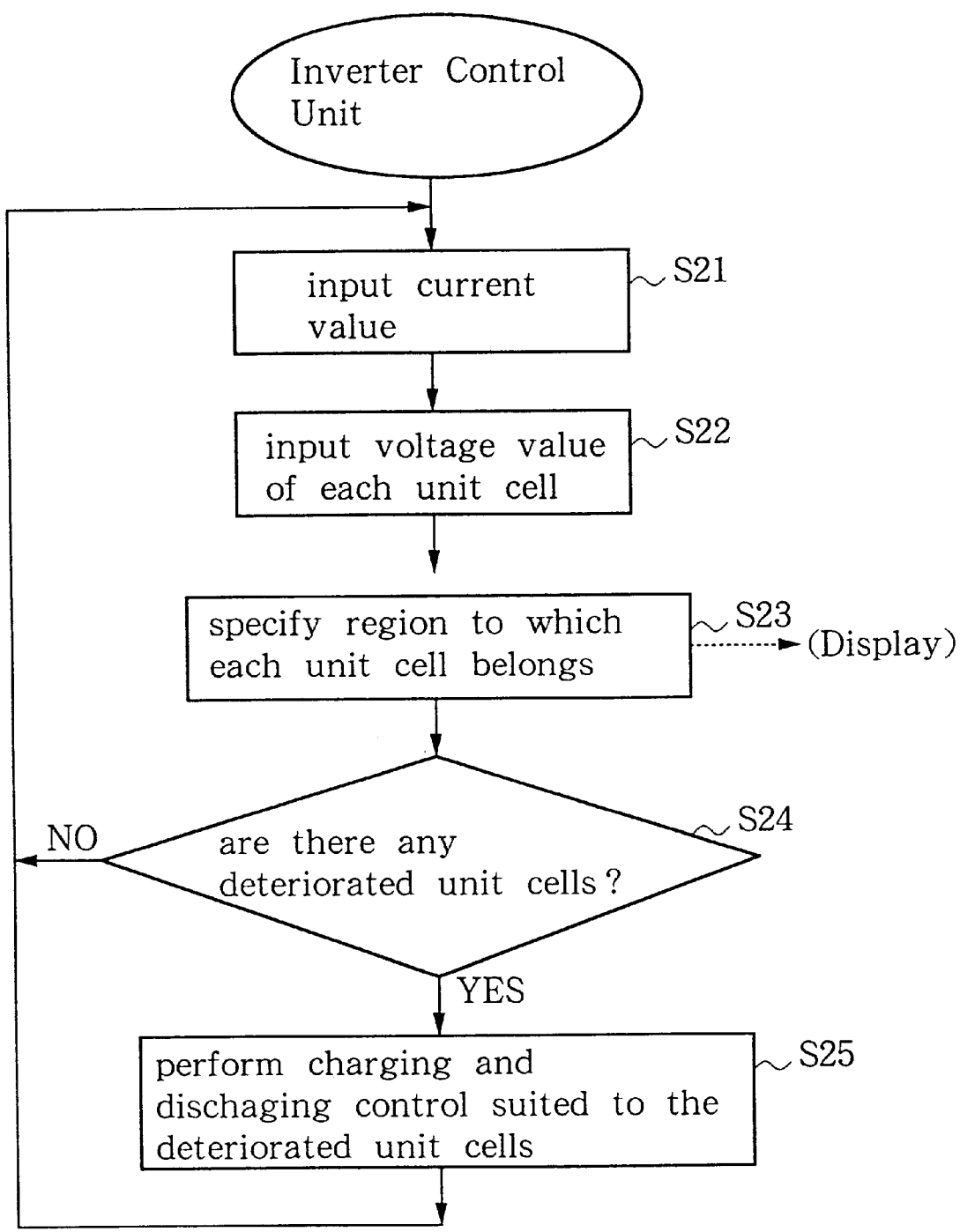
FIG. 11 is a flowchart showing the operating flow of the inverter control unit in the second embodiment of the present invention.

FIG. 11 is a flowchart showing the operating flow of the inverter control unit in the second embodiment of the present invention. The value of the current detected by current detector 7 is input via detection circuit 13 to inverter control unit 50 (S21). The value of the voltage of each unit cell $B_1$ to $B_n$ is input via battery sensors $VD_1$ to $VD_n$, radio transmitters $TX_1$ to $TX_n$, and radio receiver RX (S22). The region within which each unit cell $B_1$ to $B_n$ falls is specified (S23), as was explained in detail in the description of the first embodiment. The specified regions can also be indicated externally. On the basis of these results, it is decided whether or not there are any deteriorated cells (S24). Namely, it is decided whether or not there are any unit cells $B_1$ to $B_n$ in region C shown in FIG. 3 or in region G shown in FIG. 5. If it is found that there are deteriorated unit cells (S24), charging and discharging control suited to the deteriorated unit cells is carried out (S25). Namely, all unit cells $B_1$ to $B_n$ constituting secondary cell circuit 3 are regarded as having characteristics which fall within region C shown in FIG. 3 or region G shown in FIG. 5, and the charging and discharging control indicated in FIG. 4 or FIG. 6 are carried out. As a result, even if some of unit cells $B_1$ to $B_n$ constituting secondary cell circuit 3 are unit cells at an advanced stage of deterioration, it is possible to avoid further advance of deterioration due to overcharging or over-discharging. Moreover, making an external display of the state of deterioration can serve as a prompt for a driver or supervisor to replace any deteriorated unit cells as a matter of urgency.

As explained above, this second embodiment can obtain the same effect as the first embodiment. In particular, because voltage information is transmitted by radio signals, direct contact with the high-voltage battery as part of battery management is eliminated, thereby providing improved safety. Moreover, it is possible to obtain information which includes the value of the current and the temperature in addition to the voltage, thereby enabling detailed control data to be obtained.

Third Embodiment

Figure 12:
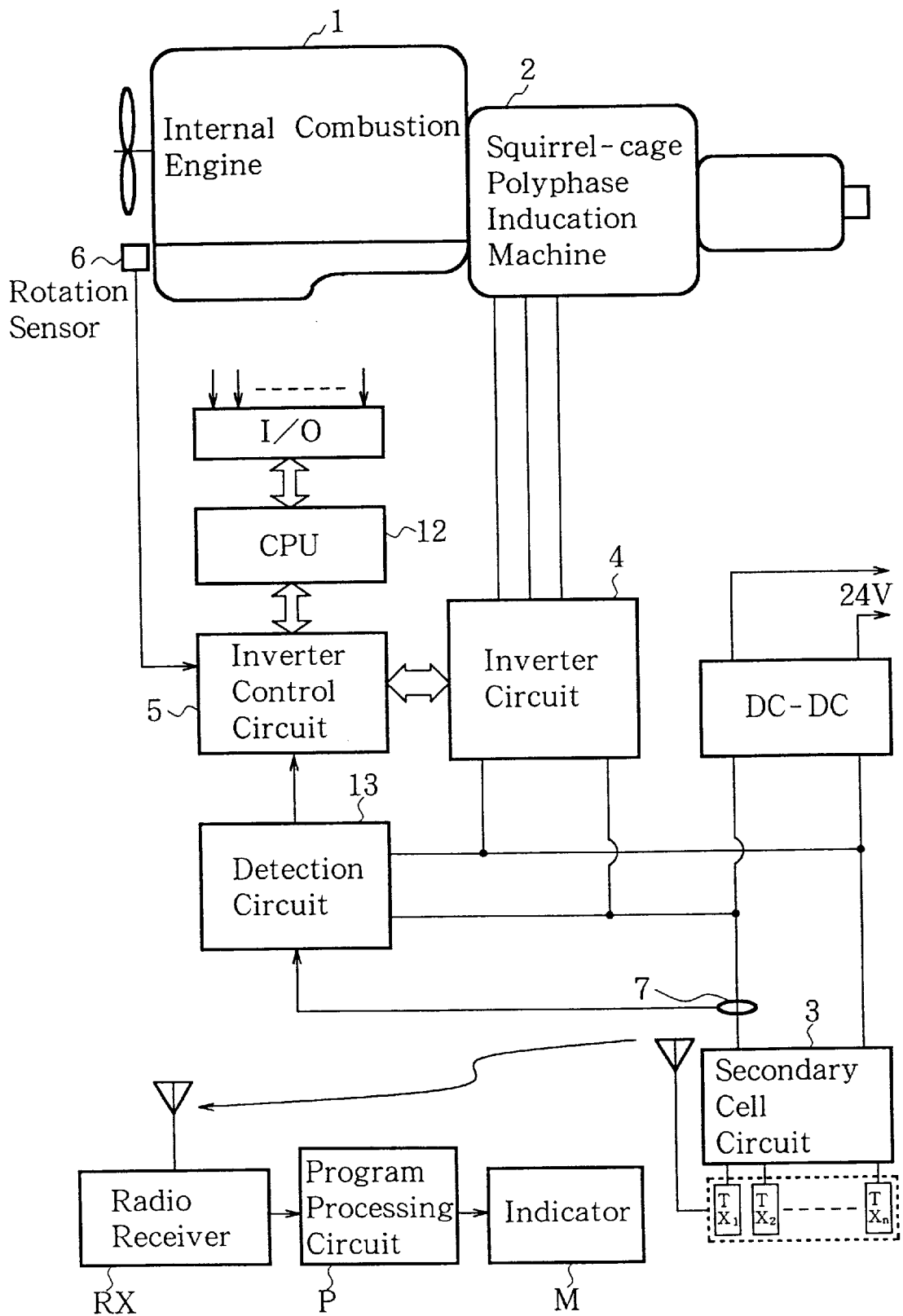
FIG. 12 is a block diagram showing the overall conFiguration of an HIMR pertaining to a third embodiment of the present invention.

The conFiguration of a third embodiment of the present invention will be explained with reference to FIG. 12 to FIG.

Figure 13:
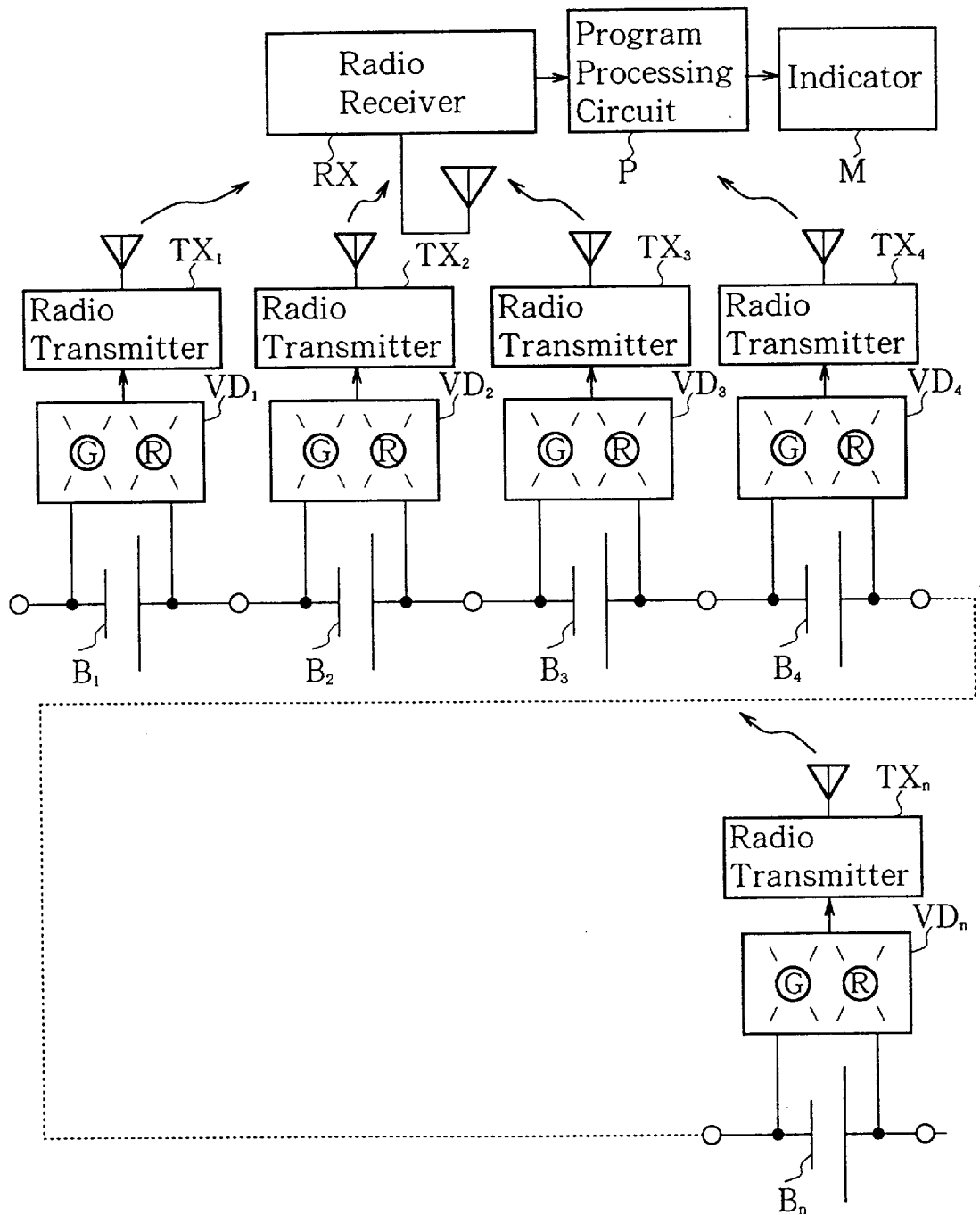
FIG. 13 is a block diagram showing the overall conFiguration of the third embodiment of the present invention.
Figure 14:
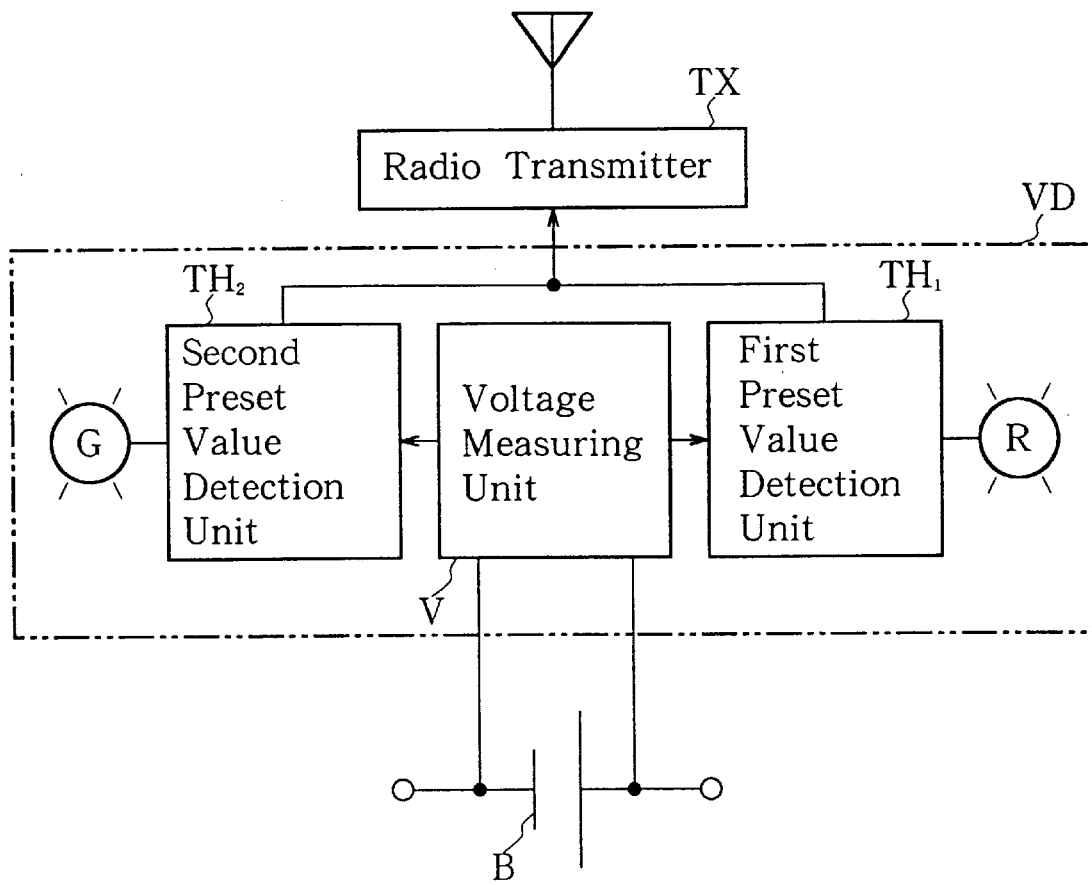
FIG. 14 is a block diagram showing the conFiguration of a voltage detection circuit in the third embodiment of the present invention.
Figure 15:
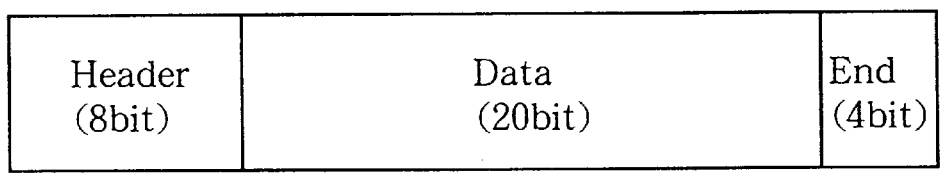
FIG. 15 shows the frame structure of the data signal used in the third embodiment of the present invention.

15. FIG. 12 shows the overall conFiguration of an HIMR pertaining to a third embodiment of the present invention. FIG. 13 is a block diagram showing the overall conFiguration of this third embodiment. FIG. 14 is a block diagram showing the conFiguration of the voltage detection circuit in this third embodiment, and FIG. 15 shows the frame structure of the data signal used in this third embodiment.

The hybrid car (HIMR) illustrated in FIG. 12 will now be explained. This vehicle is constituted in such manner that three-phase alternating current squirrel-cage polyphase induction machine 2 is coupled to the crankshaft of internal combustion engine 1, large secondary cell circuit 3 is mounted on the vehicle, this secondary cell circuit 3 and squirrel-cage polyphase induction machine 2 are coupled by means of bidirectional inverter circuit 4, and this inverter circuit 4 is controlled by inverter control circuit 5 which uses program control. Detection circuit 13 inputs the voltage of secondary cell circuit 3 and the current of current detector 7 to inverter control circuit 5. Inverter control circuit 5 controls inverter circuit 4 in accordance with the inputs from detection circuit 13, rotation sensor 6 and CPU 12.

Inverter control circuit 5 controls inverter circuit 4 in such manner that when the vehicle starts or accelerates, the rotating magnetic field applied to this squirrel-cage polyphase induction machine 2 is controlled so that squirrel-cage polyphase induction machine 2 constitutes an electric motor, and when the vehicle decelerates, the rotating magnetic field applied to squirrel-cage polyphase induction machine 2 is controlled so that squirrel-cage polyphase induction machine 2 constitutes a generator. The control performed by this system is such that secondary cell circuit 3 discharges when squirrel-cage polyphase induction machine 2 is utilized as an electric motor, and charges when induction machine 2 is utilized as a generator. In other words, this system is controlled to provide regenerative braking. It is also possible to operate internal combustion engine 1 when the hybrid car is stationary, with the sole object of charging secondary cell circuit 3.

Secondary cell circuit 3 of an actual HIMR operates at 300 V, this being obtained by connecting twenty-five 12 V automobile lead storage batteries in series. However, the explanation given here is not restricted to 12 volts or twenty-five batteries. Instead, in order to make the situation easy to understand in general terms, an explanation will be given of the case where n unit cells $B_1$ to $B_n$ are connected in series.

The third embodiment of the present invention is an information transmission arrangement for a vehicle-mounted battery, and its distinguishing features are that, as shown in FIG. 13, unit cells $B_1$ to $B_n$ are respectively provided with battery sensors $VD_1$ to $VD_n$ as sensors for detecting voltage information relating to these unit cells $B_1$ to $B_n$, and radio transmitters $TX_1$ to $TX_n$ for transmitting radio signals which have been modulated by the output of these battery sensors $VD_1$ to $VD_n$, and radio receiver RX for receiving these radio signals is disposed in or in the vicinity of the battery compartment; and separate information relating to each unit cell $B_1$ to $B_n$ is received at this radio receiver RX. In this example there is one radio receiver RX for n radio transmitters $TX_1$ to $TX_n$. The output of radio receiver RX is displayed via program processing circuit P on indicator M.

As shown in FIG. 14, battery sensor VD has voltage measuring unit V which measures the voltage of unit cell B, and also has first preset value detection unit $TH_1$ and second preset value detection unit $TH_2$, and appurtenant to these, red lamp R and green lamp G.

In each period t, radio transmitter TX intermittently transmits, at 64 kb/s, a data signal with a 32-bit frame structure of the sort shown in FIG. 15. An ID which has been individually allocated to each transmitter TX is transmitted in the header. Receiver RX can therefore identify from which transmitter TX a received frame has been transmitted. In this embodiment, a mobile phone cell was adapted and used for this arrangement. The aforementioned period t is set in advance to a different value for each radio transmitter TX. The time taken to transmit one frame of the sort shown in FIG. 15 is approximately 20 ms. Period t is set in the range from 20 to 60 seconds so as to differ slightly for each transmitter TX. In virtue of such a constitution, radio receiver RX can receive the signal of each radio transmitter TX individually even if the transmission timings of the plurality of radio transmitters TX were to coincide, because in the next period the transmission timing would differ.

If a period is set to 20 seconds, then a time of 20 ms, within which one radio transmitter TXi is transmitting, is one thousandth of the period. Accordingly, if radio transmitters $TX_1$ to $TX_n$ respectively connected to twenty-five unit cells $B_1$ to $B_n$ transmit with random timing, there is an approximately 1 in 400 chance of a collision. Even if there were a collision, because the period t varies for each transmitter, the two signals could be received separately in the next period without collision.

Figure 16:
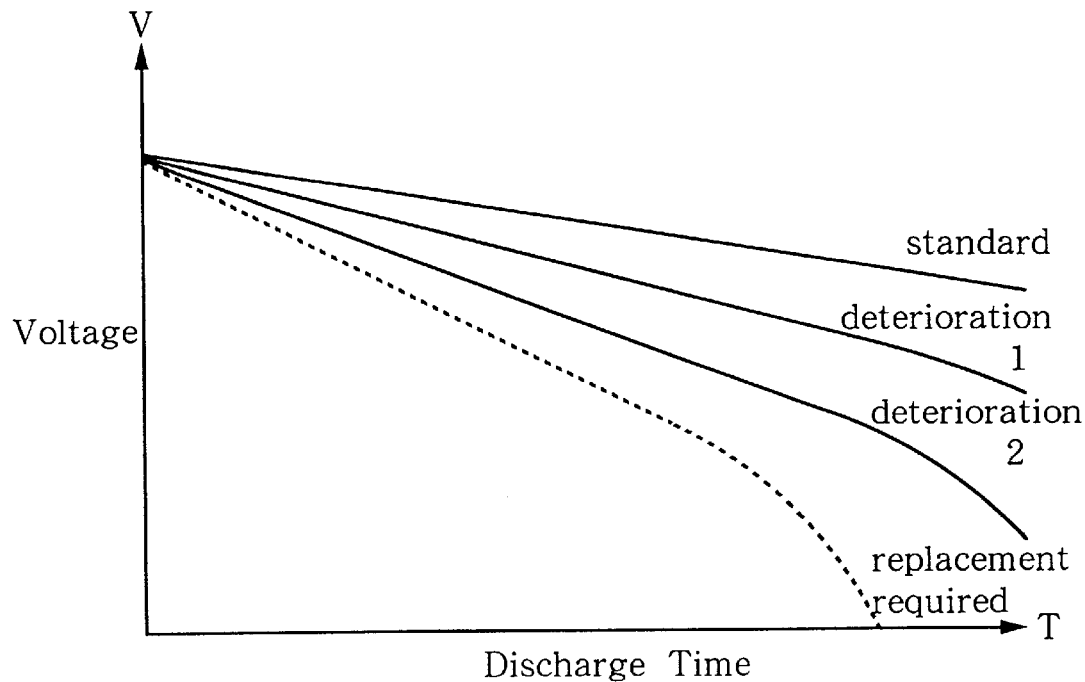
FIG. 16 shows the relation between discharge characteristics and deterioration of unit cells in the third embodiment of the present invention.
Figure 17:
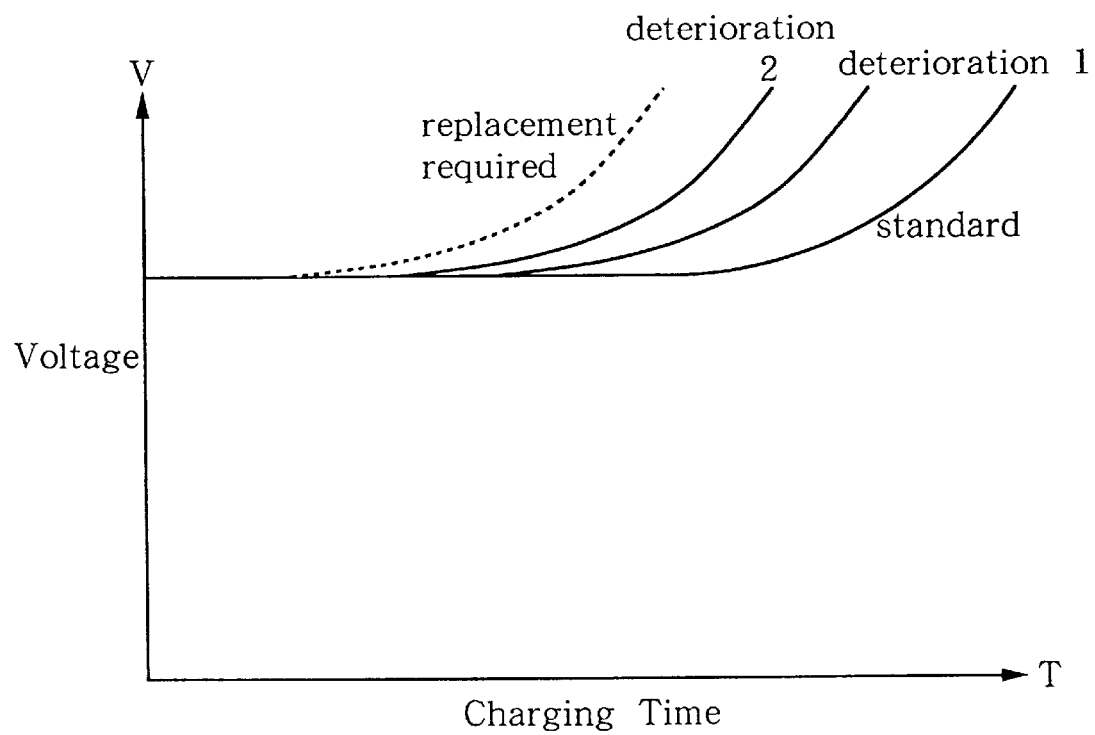
FIG. 17 shows the relation between charging characteristics and deterioration of unit cells in the third embodiment of the present invention.

Next, the operation of battery sensor VD of this third embodiment of the present invention will be explained with reference to FIG. 16 to FIG. 19. The relations between deterioration and charging and discharging characteristics in unit cells $B_1$ to $B_n$ are shown in FIG. 16 and FIG. 17. FIG. 16 shows the relation between discharge characteristics and deterioration of unit cells $B_1$ to $B_n$ with discharge time (T) taken along the horizontal axis and voltage (V) along the vertical axis. The characteristics shown are based on obtaining a fixed discharge current at a fixed load. FIG. 17 shows the relation between charging characteristics and deterioration of unit cells $B_1$ to $B_n$, with charging time (T) taken along the horizontal axis and voltage (V) taken along the vertical axis. The characteristics shown are based on charging using a fixed charging current. As FIG. 16 shows, it is found that as deterioration advances, discharge is accompanied by more rapid voltage drop. As FIG. 17 shows, it is found that as deterioration advances, voltage increases, and charging is completed, within a shorter time.

An explanation will now be given of the first preset value and the second preset value. As shown in FIG. 16 and FIG. 17, the voltage of unit cells $B_1$ to $B_n$ changes according to whether the cells are being charged or discharged (cell polarity), and according to the value of the cell current. Assuming that the standard voltage of unit cells $B_1$ to $B_n$ is 12 V, it is found that if charging and discharging are repeated in cells of a certain type with the cells in a normal state, their terminal voltage varies between 11.4 V and 13.2 V. It is therefore useful for example to take 11.4 V as the voltage at which charging is required (i.e., the first preset value) and to take 13.2 V as the voltage at which charging is ended (i.e., the second preset value). These two preset values should be set in accordance with the properties of the cells, and should include a margin according to how the cells are used.

Figure 18:
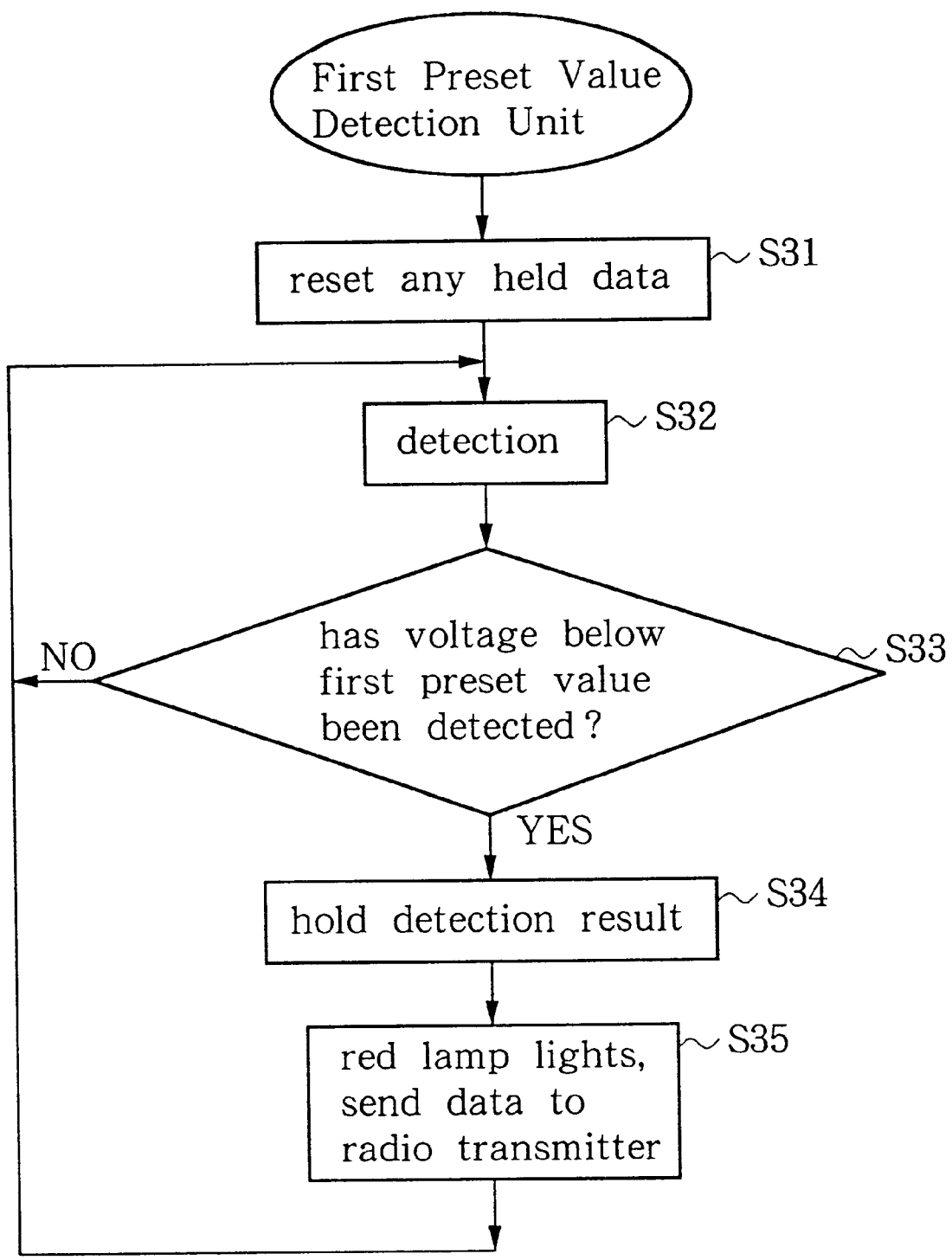
FIG. 18 is a flowchart showing the operating flow of the first preset value detection unit in the third embodiment of the present invention.

FIG. 18 is a flowchart showing the operating flow of first preset value detection unit $TH_1$ in this third embodiment of the present invention. In the flowchart shown in FIG. 18, at startup, any currently held data is first of all reset (S31). The respective voltage values of unit cells $B_1$ to $B_n$ are then detected (S32) and when a voltage value equal to or below the first preset value has been detected (S33), this result is held (S34), red lamp R lights, and the data is sent to transmitter TX (S35).

A voltage of below the first preset value (11.4 V) is generally detected when a current is being extracted from the battery, namely, when a load is being applied to unit cells $B_1$ to $B_n$. This happens when the vehicle accelerates using squirrel-cage polyphase induction machine 2 and the load on unit cells $B_1$ to $B_n$ has increased. Consequently, when the load is reduced the terminal voltage reaches a value in excess of the first preset value, and therefore if the detection history has not been held, there is a strong possibility that the detection result will disappear before it can be used as control data.

That is to say, red lamp R operates as follows. An over-discharge condition occurs in unit cells $B_1$ to $B_n$ when a load is applied, and for any unit cells $B_1$ to $B_n$ at which the voltage has decreased to below the first preset value, the red lamp will continue to light even though the terminal voltage rises again. Subsequently, if the voltage increases further and reaches the second preset value, green lamp G lights, but even then the red lamp continues to light. The data sent to radio transmitter TX is sent only once.

Figure 19:
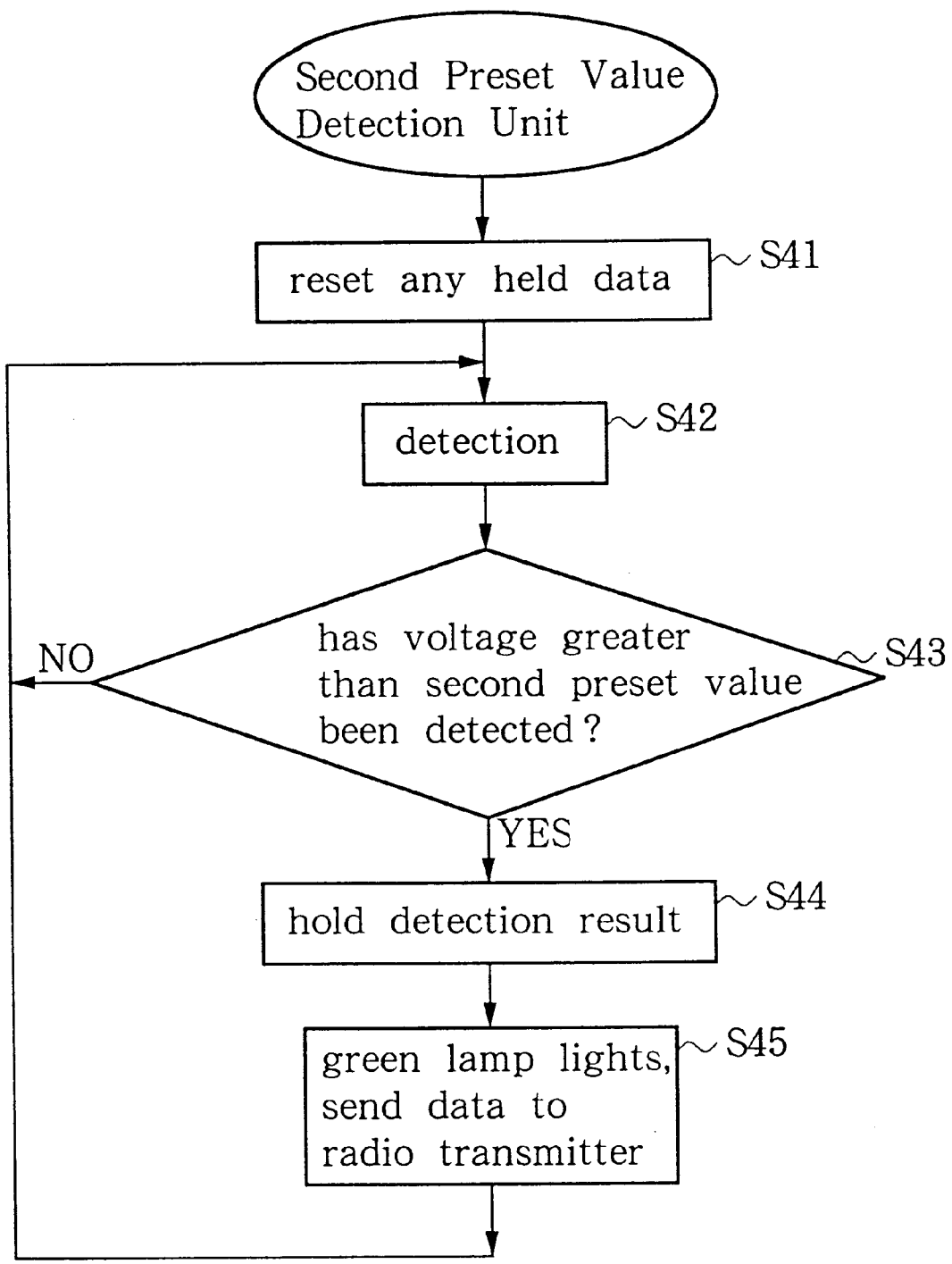
FIG. 19 is a flowchart showing the operating flow of the second preset value detection unit in the third embodiment of the present invention.

FIG. 19 is a flowchart showing the operation of second preset value detection unit $TH_2$ of the third embodiment of the present invention. As shown in this flowchart, at startup any currently held data is first of all reset (S41). The voltage values of each unit cell $B_1$ to $B_n$ are then detected (S42) and if a voltage value equal to or greater than the second preset value is detected (S43), this result is held (S44), and green lamp G lights and the data is sent to radio transmitter TX (S45).

Green lamp G lights when the terminal voltage of a unit cell $B_1$ to $B_n$ exceeds the second preset value. In this example, green lamp G remains lit as well. Green lamp G lights when overcharging occurs in a unit cell $B_1$ to $B_n$. Thereafter, even if discharge is carried out and the overcharging condition is eliminated, green lamp G remains lit. The data sent to radio transmitter TX is sent only once.

Red lamp R and green lamp G are not directly related to the present invention. However, after a vehicle equipped with this control system has finished operating, the driver or supervisor can ascertain the state of unit cells B hd 1to $B_n$ by means of the lighting of the red lamps and the green lamps. In particular, if deterioration is advanced in a certain unit cell $B_i$, the red lamp and green lamp of that unit cell $B_i$ will tend to light before those of the other unit cells, and therefore a supervisor can perform efficient inspection by simply inspecting unit cell $B_i$ on which the red lamp and the green lamp are lit.

Figure 20:
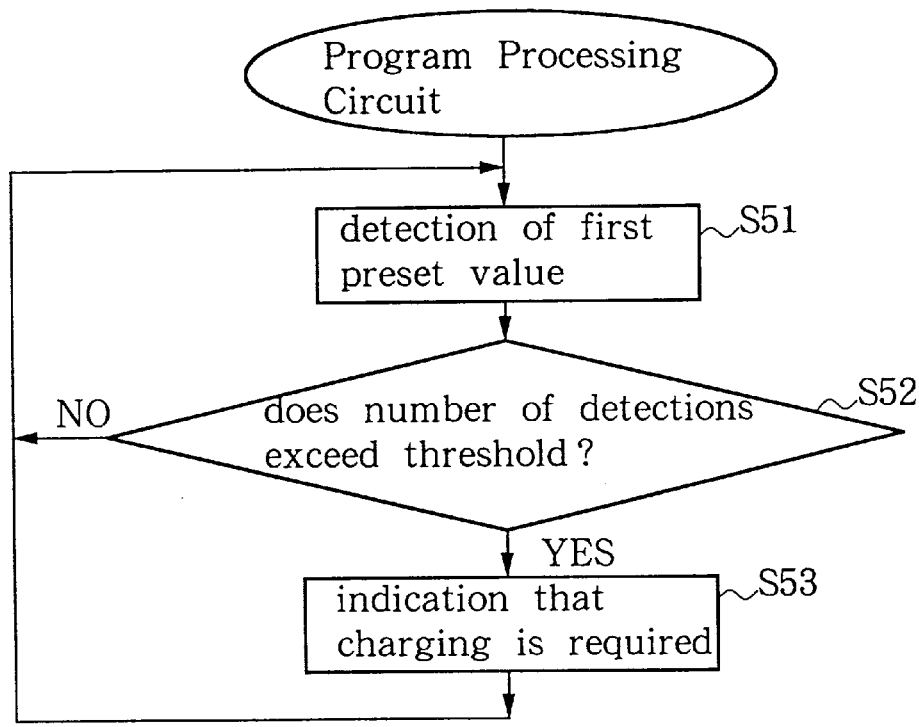
FIG. 20 is a flowchart showing the operating flow pertaining to detection of the first preset value by the program processing circuit in the third embodiment of the present invention.

Next, the operation of program processing circuit P in this third embodiment of the present invention will be explained with reference to FIG. 20 to FIG. 22. FIG. 20 is a flowchart showing the operating flow pertaining to detection of the first preset value by the program processing circuit in this third embodiment. If information relating to the detection of the first preset value is input to program processing circuit P (S51), it is decided whether the number of unit cells at which the first preset value has been detected exceeds a threshold (S52). If the threshold is exceeded, an indication that charging is required is output to indicator M (S53). Indicator M is a liquid crystal display panel provided at the driver's seat.

Namely, as previously explained it is known that the performance of a plurality of unit cells B has variability, and that the voltage of a unit cell $B_i$ in which deterioration is advanced falls to the first preset value sooner than other unit cells B. However, if the number of unit cells B at which the voltage has fallen to the first preset value is a large proportion of the total number of unit cells, it can be judged that on the whole charging is necessary. Program processing circuit P outputs to indicator M a display for making information to this effect known to the driver or supervisor.

Figure 21:
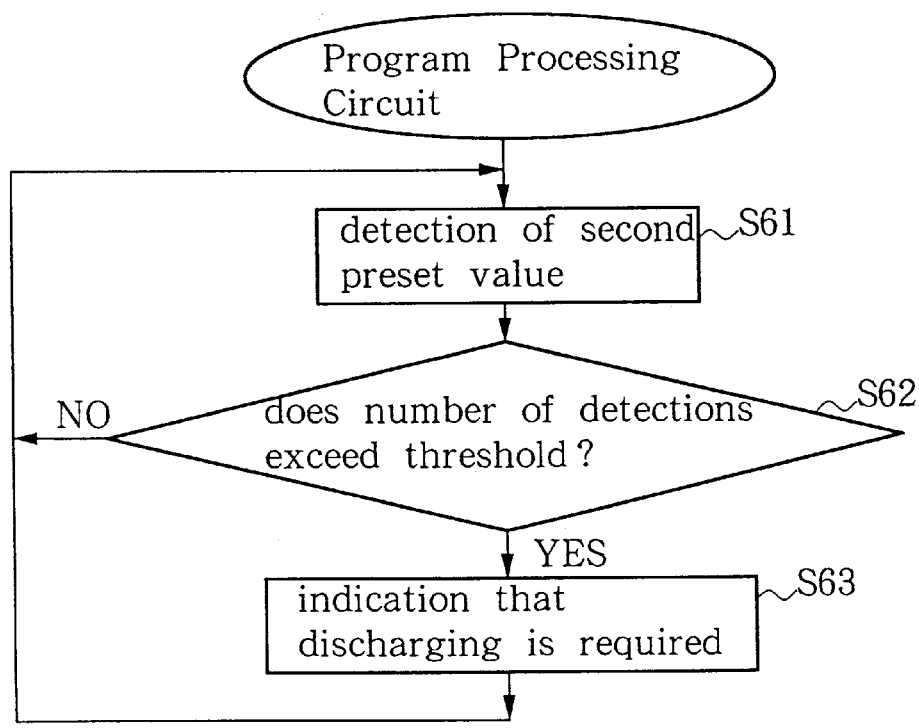
FIG. 21 is a flowchart showing the operating flow pertaining to detection of the second preset value by the program processing circuit in the third embodiment of the present invention.

FIG. 21 is a flowchart showing the operating flow pertaining to detection of the second preset value by the program processing circuit in this third embodiment. If information relating to the detection of the second preset value is input to program processing circuit P (S61), it is decided whether the number of unit cells at which the second preset value has been detected exceeds a threshold (S62). If the threshold is exceeded, an indication that discharging is required is output to indicator M (S63).

Namely, if the number of unit cells B at which the voltage has risen to the second preset value is a large proportion of the total number of unit cells, it can be judged that on the whole charging has been completed. Program processing circuit P outputs to indicator M a display for making information to this effect known to the driver or supervisor.

The output of this indicator M is displayed at the driver's seat where it prompts the driver to drive appropriately. In addition, however, it can be utilized to modify the control state by being applied to CPU 12 shown in FIG. 12. Namely, when the battery is only slightly charged, it is controlled so that the contribution of internal combustion engine 1 during acceleration is increased, whereas when the battery is well charged the contribution of the electric motor during acceleration is increased. The battery is also controlled so that when the battery is only slightly charged, the contribution of regenerative braking during deceleration is increased and more braking energy is regenerated in the battery, whereas when the battery is well charged the contribution of regenerative braking during deceleration is decreased and energy is dissipated by frictional braking.

Figure 22:
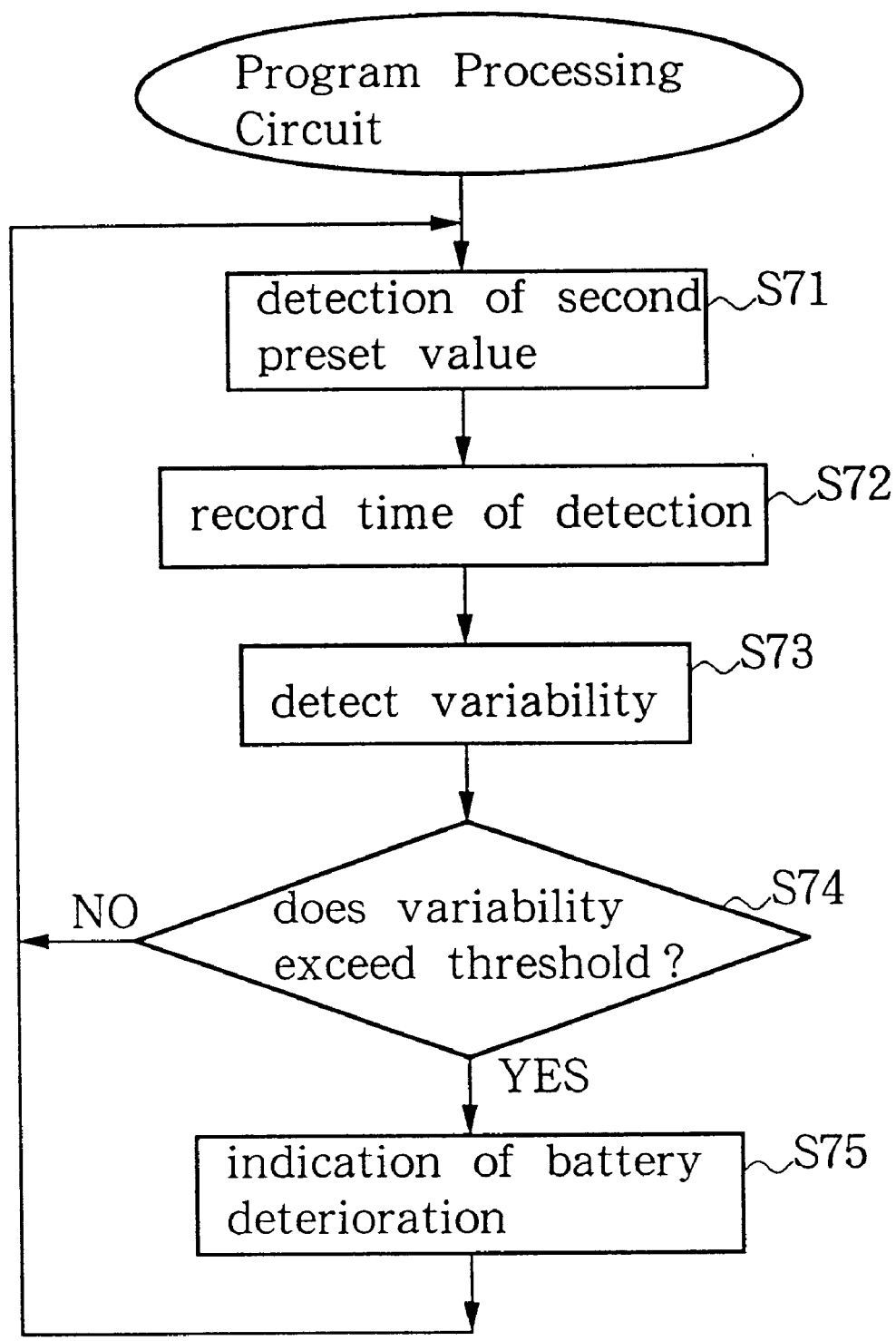
FIG. 22 is a flowchart showing another operating flow pertaining to detection of the second preset value by the program processing circuit in the third embodiment of the present invention.

FIG. 22 is a flowchart showing another operating flow pertaining to the detection of the second preset value by program processing circuit P in this third embodiment of the present invention. If information relating to the detection of the second preset value is input to program processing circuit P (S71), the time of this detection is recorded (S72). The variability of these second preset value detection times is also detected over the plurality of unit cells B (S73). If there is a unit cell $B_i$ for which this variability deviates by more than a certain threshold from the average range of variability within which the great majority of other unit cells B are contained (S74), battery deterioration is indicated for this unit cell $B_i$ (S75).

Namely, as shown in FIG. 17, a cell in which deterioration is advanced generally has a shorter charging and discharging time than a cell which has not deteriorated. Cells in which deterioration is advanced can therefore be extracted by noticing any cells for which charging is completed particularly soon compared with other cells. In the present invention, the time at which charging is completed can be detected by recording when the second preset value is detected. This can therefore be utilized to make a cell with a specific deterioration known to the driver or supervisor, by indicating on indicator M any cell for which the time required for completion of charging is considerably shorter than other cells.

Figure 23:
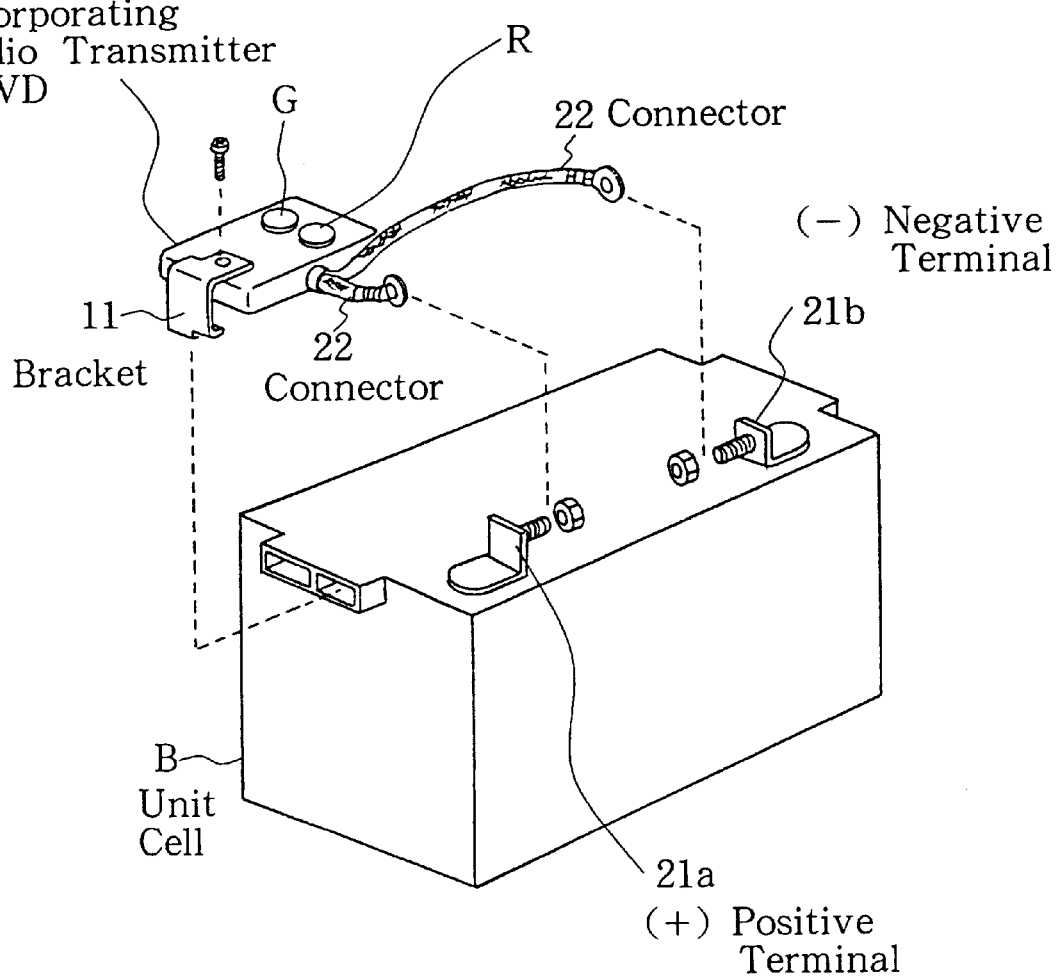
FIG. 23 serves to explain the fitting of a battery sensor incorporating a radio transmitter to a unit cell in the third embodiment of the present invention.
Figure 24:
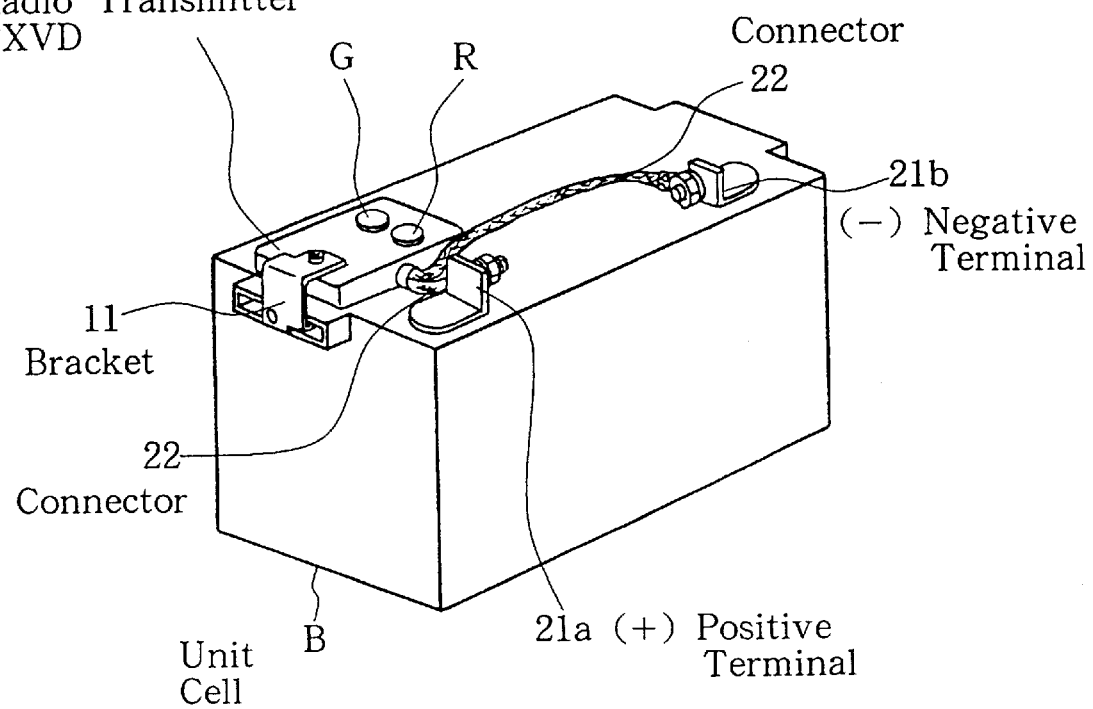
FIG. 24 shows a battery sensor incorporating a radio transmitter fitted to a unit cell in the third embodiment of the present invention.

An example of the external appearance of a unit cell B of this third embodiment of the present invention is given in FIG. 23 and FIG. 24. FIG. 23 serves to explain how battery sensor TXVD, which incorporates a radio transmitter, is attached to unit cell B in this third embodiment. FIG. 24 shows battery sensor TXVD, incorporating a radio transmitter, after it has been attached to unit cell B in this third embodiment. Battery sensor TXVD, which incorporates a radio transmitter, and switching circuit SW are connected on top of unit cell B to terminals 21a and 21b by connectors 22, and are fixed to the casing of unit cell B by bracket 11.

Figure 25:
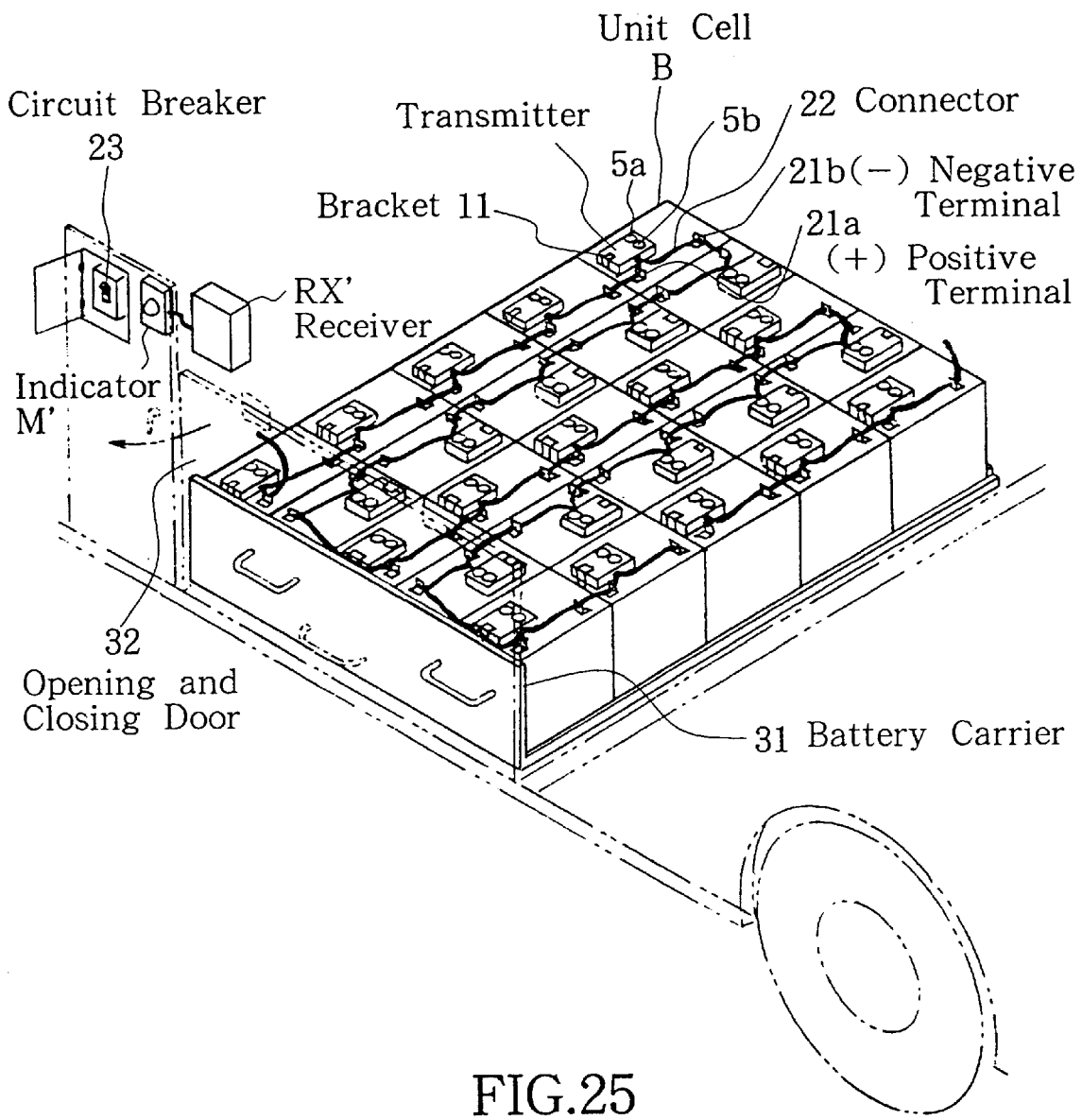
FIG. 25 shows unit cells mounted on a vehicle in the third embodiment of the present invention.

FIG. 25 shows unit cells B mounted on a vehicle in this third embodiment of the present invention. A plurality of unit cells B are mounted in centralized manner on battery carrier 31 and are housed in a battery compartment provided behind opening and closing door 32. The driver or supervisor can inspect unit cells B by pulling out battery carrier 31. In addition, receiver RX' and indicator M' are provided adjacent to opening and closing door 32, thereby enabling the condition of unit cells B to be inspected without pulling out battery carrier 31.

Figure 26:
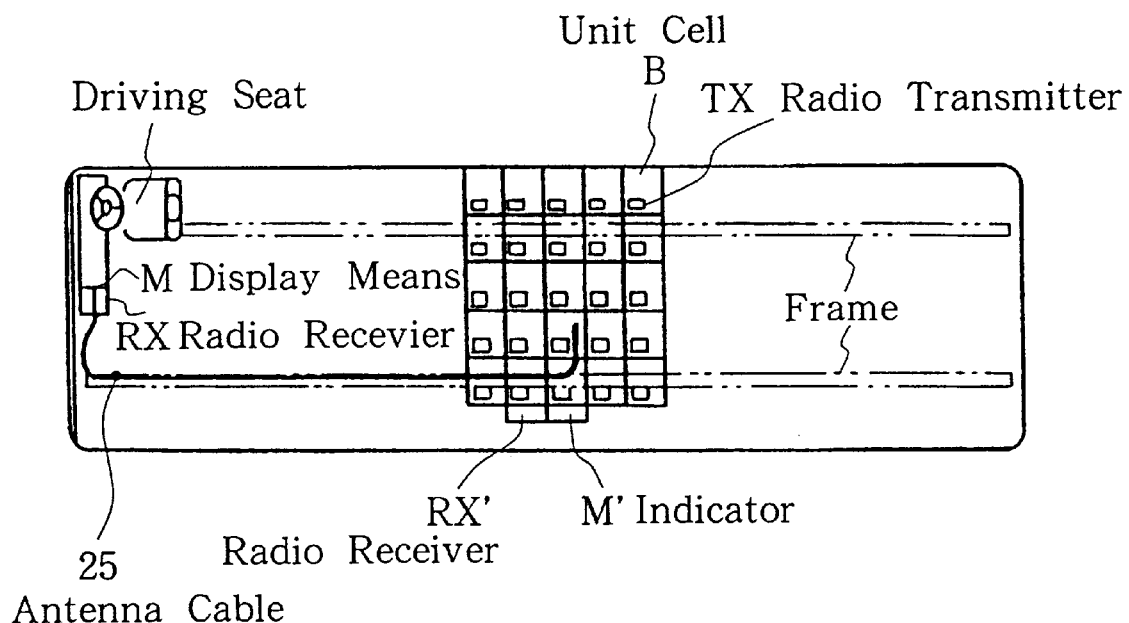
FIG. 26 shows an example of the installation of an indicator in the third embodiment of the present invention.
Figure 27:
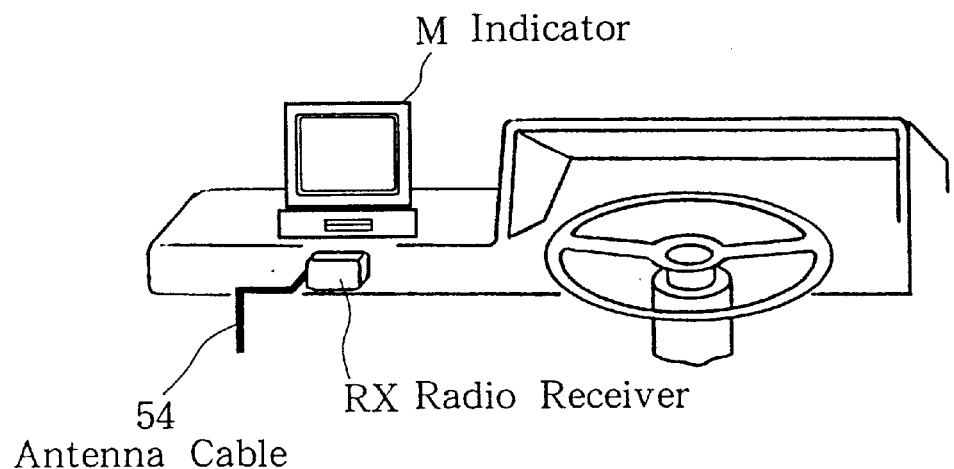
FIG. 27 shows an example of the installation of an indicator at the driver's seat in the third embodiment of the present invention.

An example of the installation of indicator M in this third embodiment of the present invention is shown in FIG. 26 and FIG. 27. As shown in FIG. 26, the driver or supervisor can ascertain the state of unit cells B, without opening the battery compartment, by means of radio receiver RX and indicator M installed at the driver's seat, and via radio receiver RX' and indicator M' installed in the battery compartment, and antenna cable 24.

This enables the management of unit cells to be carried out easily and rapidly. In particular, indicator M set up at the driver's seat as shown in FIG. 27 enables the driver to ascertain, while driving, whether charging and discharging are required or not, and the state of deterioration of unit cells B.

As has been explained above, the present invention makes maintenance and inspection easy and can serve to increase the working life of batteries. It can also simplify battery maintenance. Further, the present invention enables maintenance personnel to make measurements without touching live parts of the battery. It also enables the state of deterioration of the battery to be found while the battery is in use. In other words, the state of a battery mounted on an electric vehicle can be detected while the vehicle is operating.

Fourth Embodiment

Figure 28:
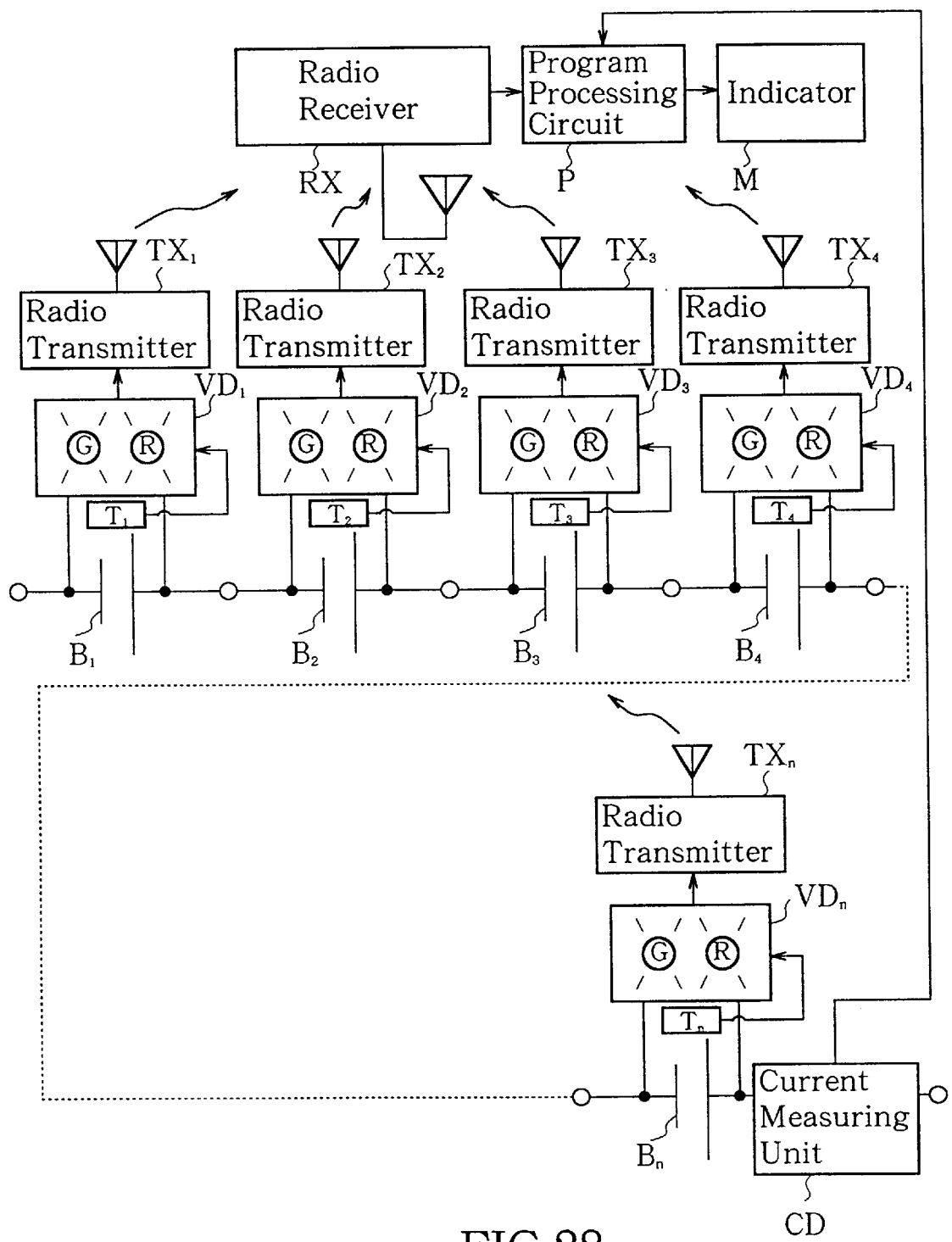
FIG. 28 is a block diagram showing the overall conFiguration of a fourth embodiment of the present invention.

A fourth embodiment of the present invention will be explained with reference to FIG. 28 and FIG. 29. FIG. 28 is a block diagram showing the overall conFiguration of this fourth embodiment, of which the object is to perform still more detailed control by providing current measuring unit CD so that control is based on current as well as voltage. In this fourth embodiment, because unit cells $B_1$ to $B_n$ are connected electrically in series, only one current measuring unit CD is provided in this series-connected circuit. The current measuring unit CD used in this embodiment does not cut the series-connected circuit. Instead, current is measured by providing a Hall element in proximity to the current path Accordingly, the state of deterioration of unit cells $B_1$ to $B_n$ can be detected by measuring voltage and current.

Figure 29:
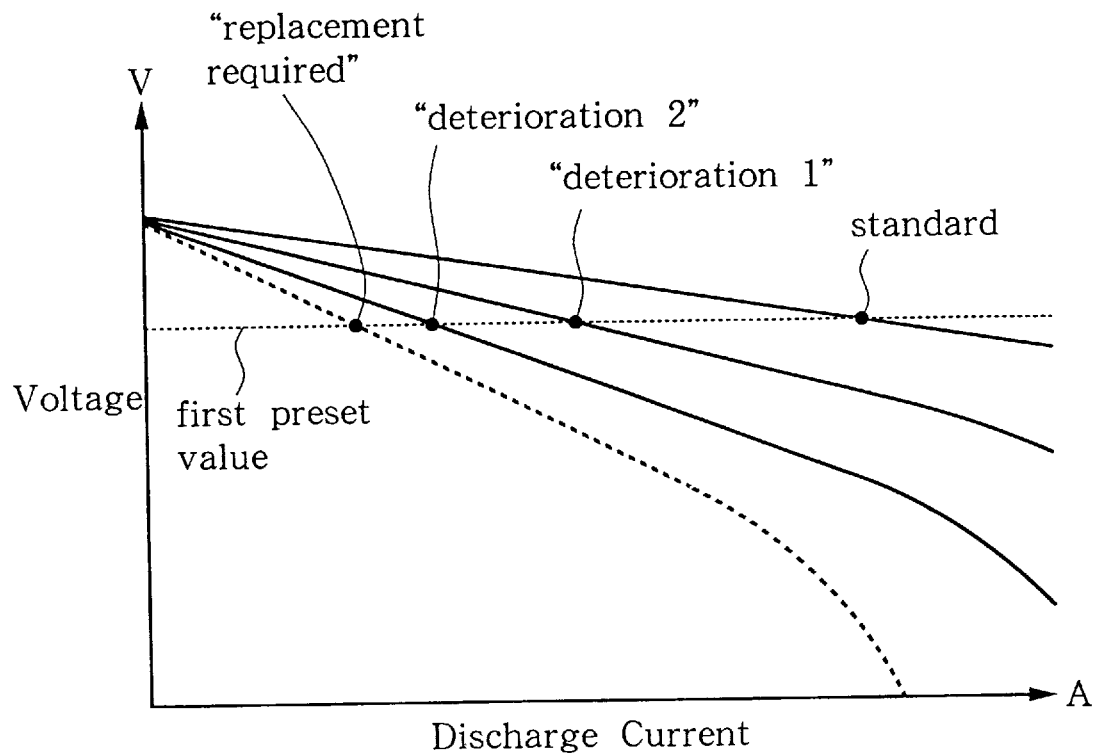
FIG. 29 shows the relation between discharge characteristics and deterioration of unit cells in the fourth embodiment of the present invention.
Figure 30:
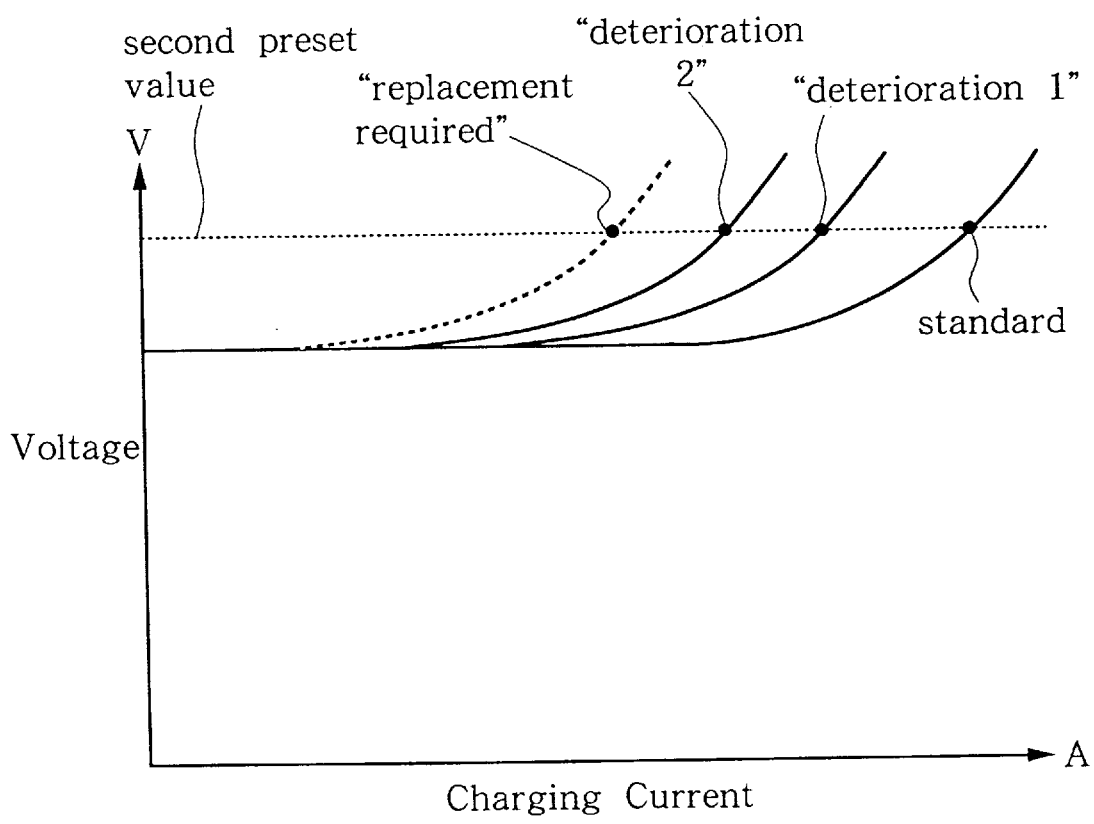
FIG. 30 shows the relation between charging characteristics and deterioration of unit cells in the fourth embodiment of the present invention.

The relation between charging and discharging characteristics and deterioration in unit cells $B_1$ to $B_n$ is shown in FIG. 29 and FIG. 30, these Figures giving schematic representations of battery characteristics. FIG. 29 shows the relation between discharge characteristics and deterioration of unit cells $B_1$ to $B_n$ in this fourth embodiment of the present invention, with discharge current (A) taken along the horizontal axis and voltage (V) along the vertical axis. FIG. 30 shows the relation between charging characteristics and deterioration of unit cells $B_1$ to $B_n$ in this fourth embodiment, with charging current (A) taken along the horizontal axis and voltage (V) along the vertical axis. As shown in FIG. 29, the voltage drop accompanying an increase in the discharge current becomes larger as deterioration proceeds. As shown in FIG. 30, the voltage rise accompanying an increase in charging current becomes larger as deterioration proceeds. In other words, a unit cell in an advanced stage of deterioration has a smaller storage capacity.

Program processing circuit P has a memory which stores the relations between charging and discharging characteristics and deterioration shown in FIG. 29 and FIG. 30, and can detect the state of deterioration of unit cells $B_1$ to $B_n$ from the relation between a first preset value or a second preset value, these being sent as radio signals, and the corresponding value of the electric current. The results of this detection are displayed on indicator M as for example "unit cell $B_i$: deterioration 1", "unit cell $B_j$: deterioration 2", "unit cell $B_m$: replacement required", and so forth.

The mounting of unit cells B and the arrangement of indicator M are the same as in the third embodiment.

Fifth Embodiment

Figure 31:
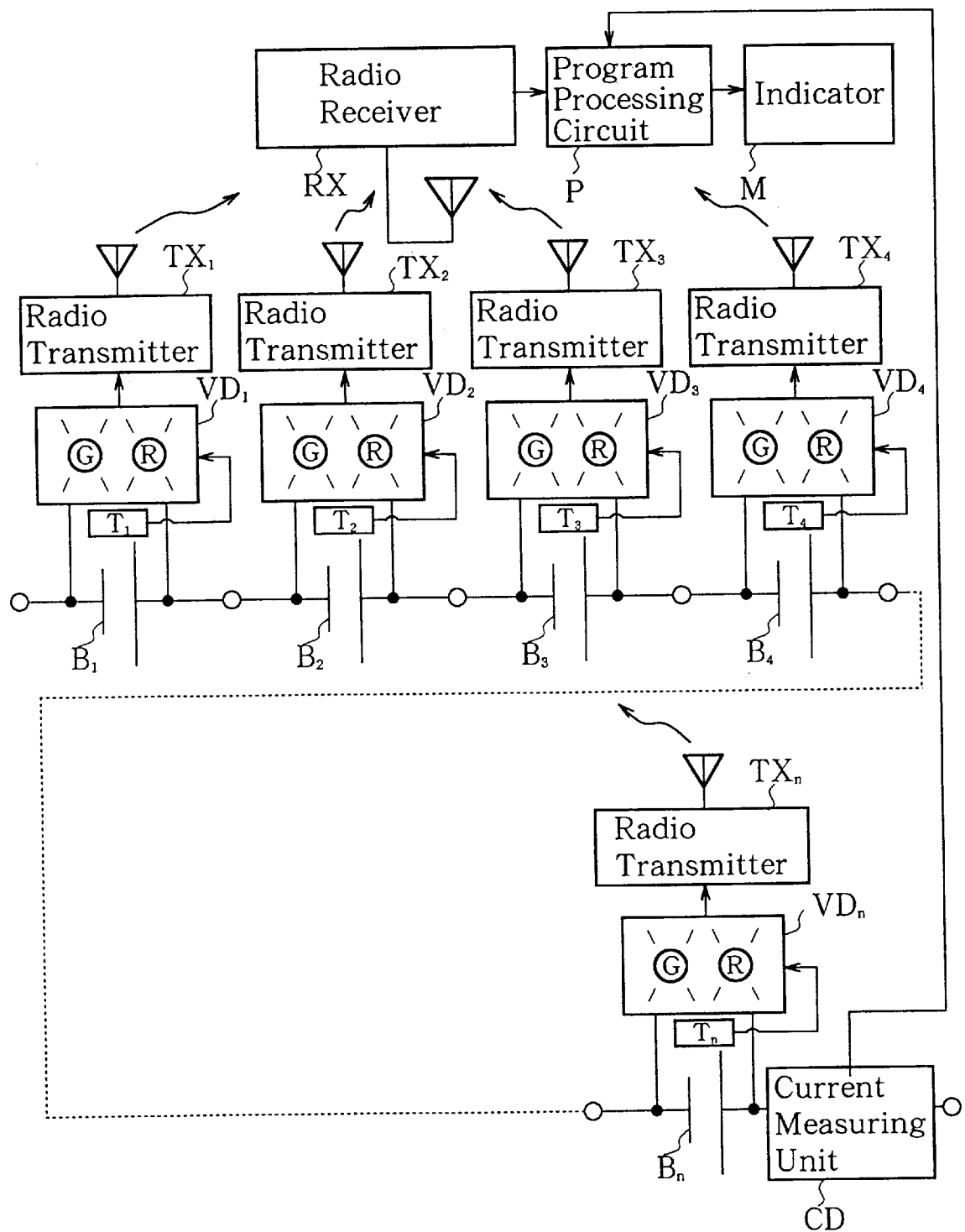
FIG. 31 is a block diagram showing the overall conFiguration of a fifth embodiment of the present invention.
Figure 32:
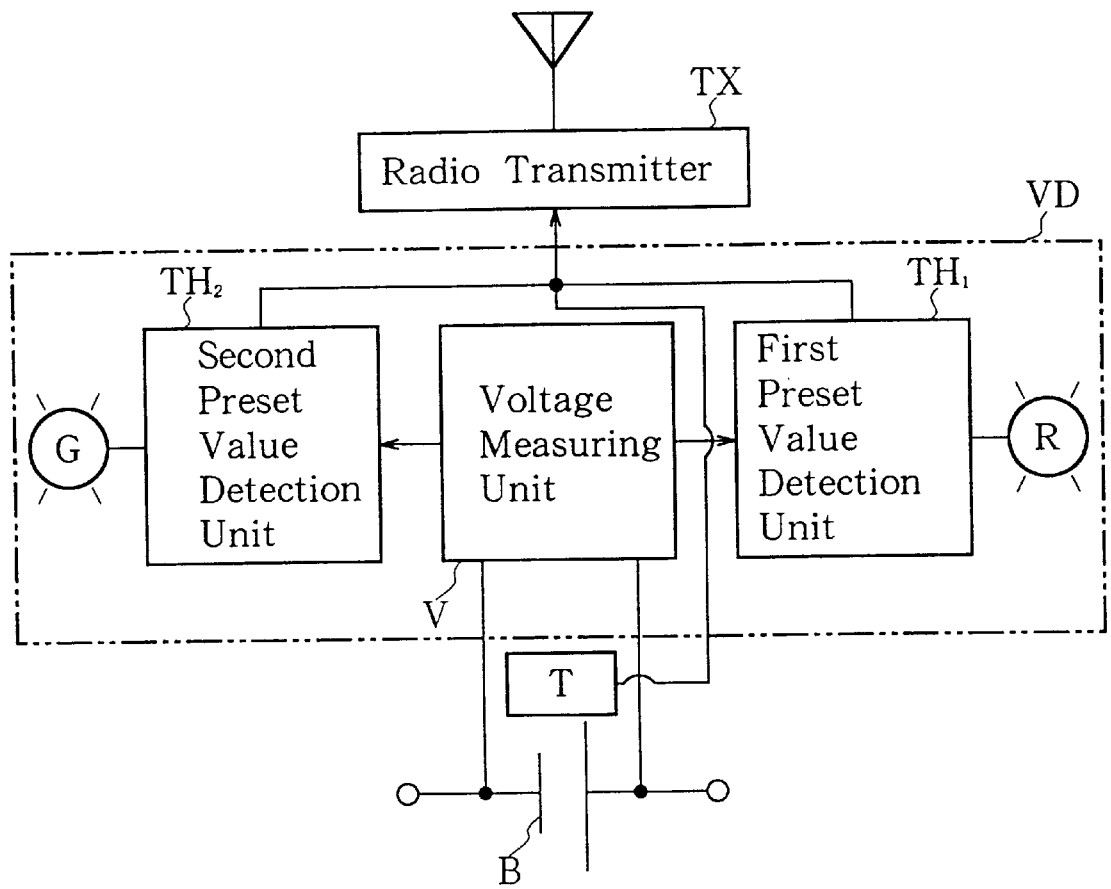
FIG. 32 is a block diagram showing the conFiguration of a battery sensor in the fifth embodiment of the present invention.

A fifth embodiment of the present invention will be explained with reference to FIG. 31 and FIG. 32. FIG. 31 shows the overall conFiguration of this fifth embodiment of the present invention, while FIG. 32 is a block diagram showing the conFiguration of a battery sensor in this fifth embodiment. The distinguishing feature of this fifth embodiment is that it provides temperature sensors $T_1$ to $T_n$ for respective unit cells $B_1$ to $B_n$. The data signal transmitted by radio transmitter TX contains, as well as the voltage information explained in the third embodiment, information relating to temperature as measured by temperature sensor T.

Program processing circuit P can detect the state of deterioration of individual unit cells $B_1$ to $B_n$ in accordance with this voltage information and temperature information transmitted via radio receiver RX, and in accordance with the current information obtained from current measuring unit CD. In other words, it can detect the state of deterioration by comparing the voltage and current information with the volt-ampere characteristics shown in FIG. 29 and FIG. 30 in the manner indicated in the fourth embodiment, but if there are a plurality of unit cells exhibiting equal volt-ampere characteristics, it can refer to the temperature information and specify a unit cell with a higher temperature than other unit cells as a unit cell in which deterioration is particularly advanced. The results of this detection are displayed on indicator M as "unit cell $B_i$: deterioration 1", "unit cell $B_j$: deterioration 2", "unit cell $B_m$: replacement required", and so forth.

In this fifth embodiment of the present invention as well, the mounting of unit cells B and the arrangement of indicator M are the same as in the third embodiment.

We claim:

1. A control system for a vehicle-mounted battery, comprising:

a polyphase alternating current rotating machine coupled to a driving gear of a vehicle, an inverter circuit provided between said polyphase alternating current rotating machine and a battery mounted on the vehicle, said inverter performing at least one of AC-to-DC and DC-to-AC conversion, a program control circuit for controlling said inverter circuit; and means for measuring the current and voltage of said battery during discharge and during charging;

wherein said program control circuit comprises means for controlling, via said inverter and on the basis of the voltage and current information measured by said means, the current at least during one of the charging and discharging of the battery, wherein said battery is provided with battery sensors for detecting terminal voltage of unit cells;

the detection output of said battery sensors being supplied to the program control circuit; the program control circuit comprising means for adjusting at least one of the charging and discharging current in accordance with the unit cell terminal voltage, and wherein the unit cells are each provided with an aforesaid battery sensor and with a transmitter for transmitting radio signals which has been modulated by the output of said battery sensor; and a receiver for receiving said radio signals is disposed in or in the vicinity of the battery compartment which houses the unit cells; and separate information relating to each unit cell is received at said receiver.

2. A control system for a vehicle-mounted battery according to claim 1, wherein the program control circuit comprises memory means for holding information regarding current and voltage during discharge (discharge IV characteristics) and current and voltage during charging (charging IV characteristics).

3. A control system for a vehicle-mounted battery according to claim 1, wherein the radio signals contain identification codes which have been respectively set for each unit cell.

4. A control system for a vehicle-mounted battery according to claim 2 or 3, wherein the battery sensor includes a current sensor for detecting information relating to the current of the unit cells.

5. A control system for a vehicle-mounted battery according to claim 2, 1 or 3, wherein the battery sensor includes temperature sensors for detecting information relating to the temperature of the unit cells.

6. A control system for a vehicle-mounted battery according to claim 2, 1 or 3, which has a program control circuit for processing the aforementioned information.

* * * * *